(12) United States Patent
Glenn

(10) Patent No.: US 6,667,544 B1
(45) Date of Patent: Dec. 23, 2003

(54) STACKABLE PACKAGE HAVING CLIPS FOR FASTENING PACKAGE AND TOOL FOR OPENING CLIPS

(75) Inventor: Thomas P. Glenn, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 146 days.

(21) Appl. No.: 09/608,419

(22) Filed: Jun. 30, 2000

(51) Int. Cl.[7] .............................................. H01L 23/02
(52) U.S. Cl. ....................................... 257/686; 257/777
(58) Field of Search ................................ 257/666, 686, 257/726, 727, 777

(56) References Cited

U.S. PATENT DOCUMENTS

| | | | |
|---|---|---|---|
| 3,838,984 A | 10/1974 | Crane et al. ................... 37/83 |
| 4,159,221 A | 6/1979 | Schuessler .................. 156/285 |
| 4,398,235 A | 8/1983 | Lutz et al. .................. 361/393 |
| 4,833,568 A | 5/1989 | Berhold ...................... 361/383 |
| 4,956,694 A | * 9/1990 | Eide ........................... 361/396 |
| 4,996,587 A | 2/1991 | Hinrichsmeyer et al. ..... 357/74 |
| 5,068,713 A | 11/1991 | Toda ........................... 357/80 |
| 5,230,759 A | 7/1993 | Hiraiwa ....................... 156/69 |
| 5,239,198 A | 8/1993 | Lin et al. .................... 257/693 |
| 5,258,094 A | 11/1993 | Furui et al. ................. 156/634 |
| 5,266,834 A | 11/1993 | Nishi et al. ................. 257/706 |
| 5,270,488 A | 12/1993 | Ono et al. .................... 174/35 |
| 5,332,864 A | 7/1994 | Liang et al. ............... 174/52.4 |
| 5,381,039 A | 1/1995 | Morrison .................... 257/701 |
| 5,381,047 A | 1/1995 | Kanno ........................ 257/777 |

(List continued on next page.)

FOREIGN PATENT DOCUMENTS

| | | | | |
|---|---|---|---|---|
| EP | 0794572 A2 | 9/1997 | ......... | H01L/23/495 |
| EP | 0948048 A1 | 10/1999 | ......... | H01L/23/495 |
| JP | 62097355 | 5/1987 | ........... | H01L/23/02 |
| JP | 6454749 | 3/1989 | ........... | H01L/23/28 |
| JP | 1-106456 | 4/1989 | ........... | H01L/23/50 |
| JP | 2-239651 | 9/1990 | ........... | H01L/25/10 |
| JP | 4360576 | 12/1992 | ........... | H01L/27/14 |
| JP | 6-151656 | 5/1994 | ........... | H01L/23/36 |
| JP | 406188333 A | 7/1994 | ........... | H01L/23/50 |
| JP | 406188354 A | 7/1994 | ........... | H01L/23/50 |
| JP | 406204371 A | 7/1994 | ........... | H01L/23/48 |
| JP | 406209062 A | 7/1994 | ........... | H01L/23/50 |
| JP | 406216277 A | 8/1994 | ........... | H01L/23/28 |
| JP | 406216296 A | 8/1994 | ........... | H01L/23/50 |
| JP | 406216313 A | 8/1994 | ........... | H01L/25/65 |
| JP | 7312405 | 11/1995 | ........... | H01L/23/50 |
| JP | 8125066 | 5/1996 | ........... | H01L/23/12 |
| JP | 8306853 | 11/1996 | ........... | H01L/23/50 |
| JP | 9-8205 | 1/1997 | | |
| JP | 9008206 | 1/1997 | ........... | H01L/23/50 |
| JP | 9008207 | 1/1997 | ........... | H01L/23/50 |
| JP | 9092775 | 4/1997 | ........... | H01L/23/50 |
| WO | WO 99/65282 | 12/1999 | ........... | H01L/23/12 |

*Primary Examiner*—Phat X. Cao
(74) *Attorney, Agent, or Firm*—Bever, Hoffman & Harms, LLP; James E. Parsons

(57) ABSTRACT

Embodiments of stackable packages for an electronic device, such as an integrated circuit chip or a micromachine, are disclosed. The packages may be stacked and electrically interconnected without soldering. The package includes a molded plastic body. Stacking clips are molded into the package body. Leads formed of spring metal are embedded at the bottom of the package so that a surface of the lead is exposed through the mold compound. The leads extend upwards adjacent to the sides of the package body, and extend over the top surface of the package body. A spring member, such as a crook spring, is bent into the leads. The spring member, along with the inherent spring of the spring metal, causes the leads to press against juxtaposed lead portions of a package stacked therewith, which forces the leads of the two packages against each other, thereby forming a secure electrical connection between the packages. A tool for disengaging the interconnected clips of stacked packages also is described.

25 Claims, 19 Drawing Sheets

U.S. PATENT DOCUMENTS

| | | | |
|---|---|---|---|
| 5,394,010 A * | 2/1995 | Tazawa et al. | 257/686 |
| 5,414,300 A | 5/1995 | Tozawa et al. | 257/704 |
| 5,435,057 A | 7/1995 | Bindra et al. | 29/830 |
| 5,455,387 A | 10/1995 | Hoffman et al. | 174/52.4 |
| 5,521,429 A | 5/1996 | Aono et al. | 257/676 |
| 5,587,341 A | 12/1996 | Masayuki et al. | 437/206 |
| 5,594,275 A | 1/1997 | Kwon et al. | 257/686 |
| 5,625,221 A | 4/1997 | Kim et al. | 257/686 |
| 5,656,856 A | 8/1997 | Kweon | 257/686 |
| 5,677,569 A | 10/1997 | Choi et al. | 257/686 |
| 5,715,147 A | 2/1998 | Nagano | 361/813 |
| 5,742,007 A | 4/1998 | Kornowski et al. | 174/52.3 |
| 5,744,827 A | 4/1998 | Jeong et al. | 257/686 |
| 5,760,471 A * | 6/1998 | Fujisawa et al. | 257/666 |
| 5,801,439 A | 9/1998 | Fujisawa et al. | 257/686 |
| 5,835,988 A * | 11/1998 | Ishii | 257/666 |
| 5,852,320 A * | 12/1998 | Ichihashi | 257/686 |
| 5,859,471 A | 1/1999 | Kuraishi et al. | 257/666 |
| 5,877,043 A | 3/1999 | Alcoe et al. | 438/123 |
| 5,880,403 A | 3/1999 | Czajkowski et al. | 174/35 R |
| 5,883,426 A | 3/1999 | Tokuno et al. | 257/686 |
| 5,950,074 A | 9/1999 | Glenn et al. | 438/121 |
| 5,962,810 A | 10/1999 | Glenn | 174/52.2 |
| 5,977,613 A | 11/1999 | Takata et al. | 257/666 |
| 5,986,209 A | 11/1999 | Tandy | 174/52.4 |
| 5,994,166 A | 11/1999 | Akram et al. | 438/108 |
| 6,043,430 A | 3/2000 | Chun | 174/52.4 |
| 6,091,142 A | 7/2000 | Lee | 257/713 |
| 6,114,221 A | 9/2000 | Tonti et al. | 438/455 |
| 6,130,115 A | 10/2000 | Okumura et al. | 438/124 |
| 6,143,981 A | 11/2000 | Glenn | 174/52.4 |
| 6,146,919 A * | 11/2000 | Tandy | 257/666 |
| 6,197,615 B1 | 3/2001 | Song et al. | 438/111 |
| 6,225,146 B1 | 5/2001 | Yamaguchi et al. | 438/123 |
| 6,242,281 B1 | 6/2001 | Mclellan et al. | 438/106 |
| 6,281,568 B1 * | 8/2001 | Glenn et al. | 257/666 |
| 6,320,251 B1 | 11/2001 | Glenn | 257/678 |
| 6,404,046 B1 | 6/2002 | Glenn et al. | 257/690 |
| 6,424,031 B1 | 7/2002 | Glenn | 257/686 |
| 2001/0013639 A1 * | 8/2001 | Abe | 257/666 |

* cited by examiner

STACKABLE PACKAGE HAVING CLIPS FOR FASTENING PACKAGE AND TOOL FOR OPENING CLIPS

BACKGROUND OF THE INVENTION

It is known to include a plurality of integrated circuits in a single package body as a way to increase the density of integrated circuits on a printed circuit board. U.S. Pat. No. 5,815,372 Japan Patent 56062351 provide examples of packages having two integrated circuits.

Another method to increase package density is to mount a first small outline integrated circuit package ("SOIC") having either gull wing or J lead styles on a printed circuit board. Next, the leads of a second SOIC package are cut so as to form lead stubs. The second SOIC package is then stacked on the first SOIC package, and the lead stubs are soldered to the leads of the first SOIC package. Unfortunately, this method is difficult and time consuming. Moreover, the footprint of the first SOIC package is relatively large due to the gull wing or J-style leads. Japan Patent 56062351 shows a stack of two packages.

U.S. Pat. No. 5,835,988 discloses packages that can be stacked in multiple layers.

SUMMARY OF THE INVENTION

The present invention provides packages that may easily be stacked one on top of another. Stacking the packages allows an increase in the density of packages on a printed circuit board without a corresponding increase in the area of the printed circuit board consumed thereby. Moreover, there are many ways of stacking and/or inter-connecting the packages, which gives the user great flexibility. In addition, the packages may be stacked and mounted on a printed circuit board without soldering the packages to each other or to the printed circuit board.

One embodiment of a stackable package within the present invention includes a molded package body having a bottom first surface, an opposite top second surface, side surfaces extending vertically between the first and second surfaces, and one or more stacking clips. The stacking clips are integrally connected to a side of the package body. Each stacking clip is adapted to engage a package body of a similar stackable package that is to be stacked with the package having the clip. An electronic device, such as an integrated circuit chip or a micro-machine, is within the body of the stackable package.

In one exemplary embodiment, the clip has the form of a cantilever beam, and includes a free end distal from the package body. A recess is formed in an upper, outer portion of the clip adjacent to the connection between the clip and the respective package side. The free portion of the clip has a protuberance at its distal end. The protuberance is formed so as to fit within the recess of a similar package stacked with the package having the clip.

The stackable package also includes a plurality of leads that are each electrically connected to the electronic device. Each lead has a first portion embedded at a bottom surface of the package body and having a first surface exposed at the first surface of the package body, a second portion that extends vertically adjacent to a side surface of the package body, and a third portion that extends over the top surface of the package body.

In one embodiment, the leads are formed of a spring metal, such as spring copper, and have a spring member, such as a crook shaped spring, formed into the lead. The spring metal and spring member cause the lead to apply a continuous force against the leads of another package stacked upon the package having these features, thus providing a solderless electrical connection between the stacked packages and securing the stacked packages to each other.

The stacking clips, spring metal leads, and spring member, or some combination thereof, can be incorporated into the various packages described below to ensure a secure, solderless electrical connection between the stacked packages. The stacking clips also can be engaged with a printed circuit board so that one package or a module of stacked packages can be securely mounted on a substrate, such as a printed circuit board, so that the leads of the package are electrically connected thereto.

BRIEF DESCRIPTION OF THE DRAWINGS

In the drawings of the exemplary embodiments, features of the various embodiments that are similar are usually referred to using the same numbers.

DETAILED DESCRIPTION OF THE EXEMPLARY EMBODIMENTS

The present application is related to the following pending U.S. patent applications:

1. U.S. patent application Ser. No. 09/484,192 (attorney docket M-8117-1D US), filed Jan. 18, 2000, entitled Stackable Package For Integrated Circuit.
2. U.S. patent application Ser. No. 09/484,869 (attorney docket M-8117-1D US), filed Jan. 18, 2000entitled Methods Of Making And Mounting Stackable Package For Integrated Circuit;
3. U.S. patent application Ser. No. 09/497,377 (attorney docket M-8118 US), filed Feb. 3, 2000, entitled A Module for Stacked Integrated Circuit Packages Including An Interposer;
4. U.S. patent application Ser. No. 09/566,658 (attorney docket M-8119 US), filed May 8, 2000, entitled Stackable Package Having A Cavity And A Lid For An Electronic Device; and
5. U.S. patent application Ser. No. 09/566,680 (attorney docket M-8816 US), filed May 8, 2000, entitled Stackable Package with Heat Sink. Each of the above applications 1, 2, 3, 4, and 5 are incorporated herein by reference in their respective entireties.

Figure 1:
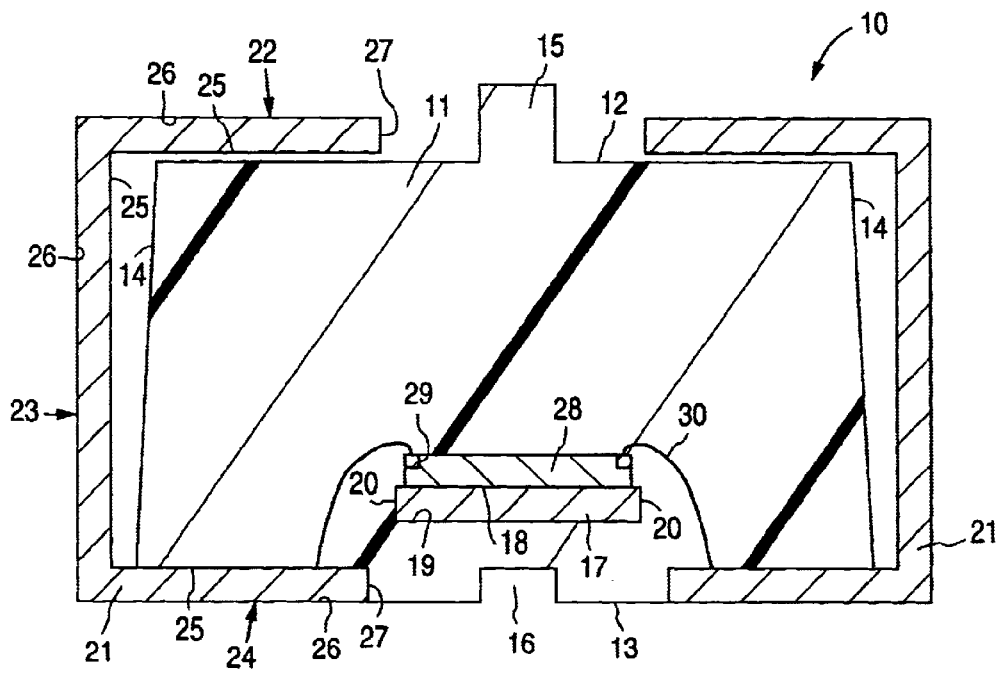
FIG. 1 is cross-sectional side view of a stackable package having an up set die pad.

FIG. 1 is a cross-sectional side view of a stackable package 10. Package 10 includes a package body 11 formed of a conventional molded, insulative encapsulant material, such as an epoxy resin. Injection molding or transfer molding may be used. Package 10 includes a largely planar upper first surface 12, an opposite largely planar lower second surface 13, and tapered peripheral side surfaces 14 that extend vertically between first surface 12 and second surface 13. Package 10 may be near-chip size and quite thin (e.g., about 0.5 to 0.7 mm).

Figure 2:
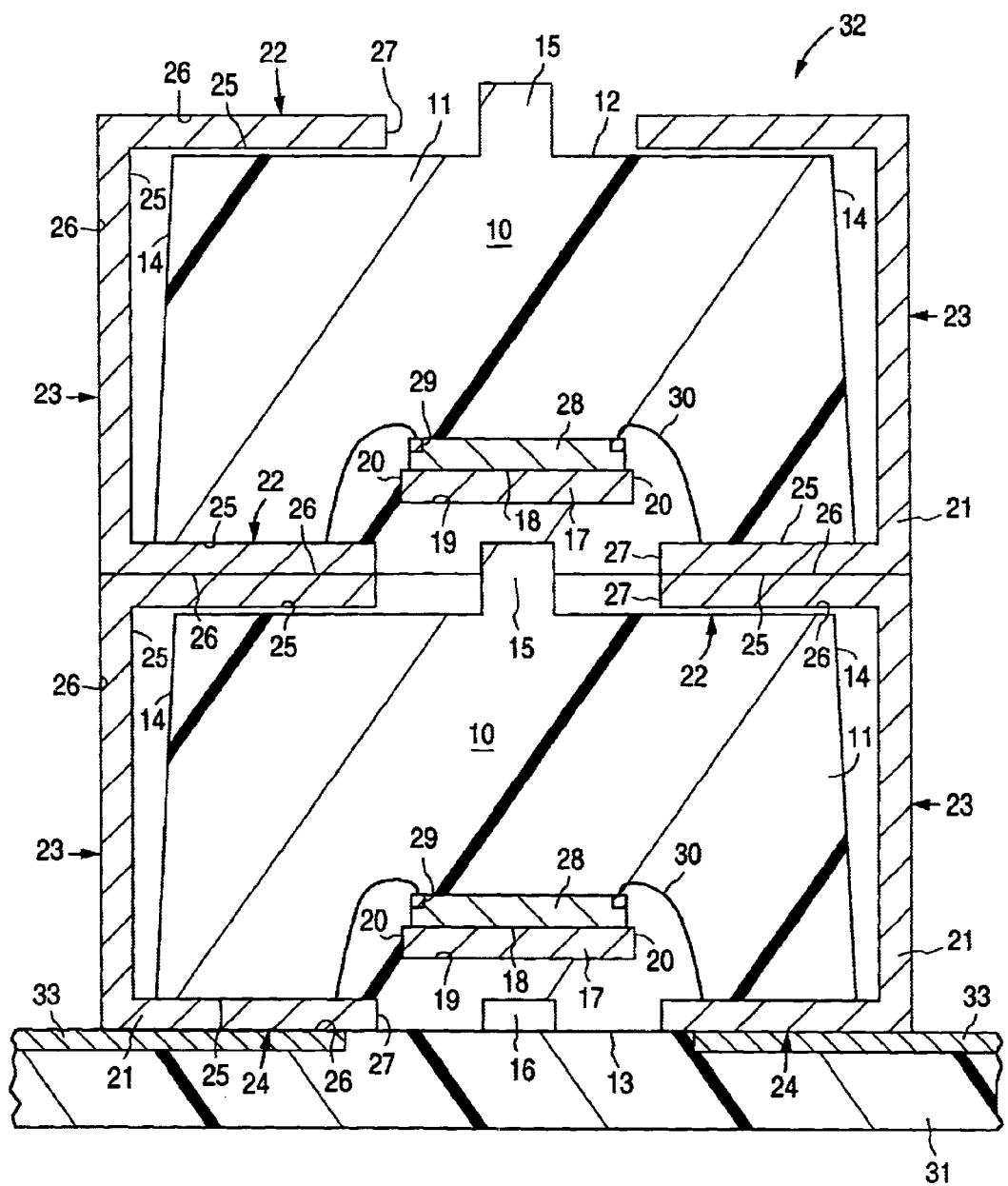
FIG. 2 is a cross-sectional side view of a stack of two packages.

Two protruding keys 15 formed of encapsulant material extend from first surface 12 of package body 11. (Only one key 15 is visible in this cross sectional view.) Second surface 13 of package body 11 includes two keyholes 16. (Only one keyhole 16 is visible in this cross sectional view.) Each key 15 is formed so as to engage with a keyhole 16 of another package that is to be stacked on first surface 12, as is shown in FIG. 2. The engagement of keys 15 into respective keyholes 16 of another package stacked thereon assures that the packages can only be stacked in one way, and avoids possible alignment and electrical interconnection errors during the assembly of a stack of packages. The number, shape and location of keys 15 and keyholes 16 of package 10 can vary.

Package 10 includes a rectangular planar metal die pad 17. Die pad 17 includes a planar first surface 18, an opposite planar second surface 19, and peripheral side surfaces 20 extending between first surface 18 and second surface 19. Die pad 17 is up set within package body 11 so that encapsulant material covers second surface 19 of die pad 17. Keyhole 16 is at lower surface 13 of package body 11 adjacent to second surface 19 of die pad 17.

Package 10 also includes a plurality of metal leads 21. Leads 21 of package 10 (and the other packages herein) may extend from one side 14 of package 10, as in a single in-line package; from two opposing sides 14 of package 10, as in a dual package; or from all four sides of package 10, as in a quad package. The number of leads 21 will vary with the application. Leads 21 may be plated with 80-20 solder for subsequent electrical connection of package 10 to a printed circuit board or to the leads of another package 10.

Leads 21 include two approximately 90° bends so as to have a C-shape. A horizontal first portion 24 of each lead 21 is embedded at second surface 13 of package body 11. A second portion 23 of each lead 21 extends vertically adjacent to side surface 14 of package 10. A horizontal third portion 22 of each lead 21 extends over and is just above or on first surface 12 of package 10. Each first portion 24, second portion 23, and third portion 22 of each lead 21 has a planar inner first surface 25, an opposite planar outer second surface 26, and side surfaces 27 extending between first surface 25 and second surface 26.

In package 10, die pad 17 is entirely within package body 11. Most of first portion 24 of each lead 21 also is within package body 11. In particular, encapsulant covers first surface 25 and side surfaces 27 of first portion 24 of each lead 21. Second surface 26 of first portion 24 of each lead 21 is not covered by encapsulant, but rather is exposed at lower second surface 13 of package body 11. Accordingly, first portion 24 of leads 21 may be electrically connected to an underlying printed circuit board or another package.

Package 10 includes an electronic device 28 within package body 11. In this embodiment, electronic device 28 in an integrated circuit chip. Integrated circuit 28 is adhesively mounted on first surface 18 of die pad 17. Bond pads 29 on integrated circuit 28 are each electrically connected by a metal bond wire 30 (e.g., gold, gold alloy, copper, or aluminum) to a first surface 25 of a first portion 24 of a lead 21.

FIG. 2 shows a module of two packages 10 mounted one on top of the other, thus forming a stack 32 of two electrically interconnected packages 10. Leads 21 of the lower package 10 are electrically connected by solder to metal traces 33 on an underlying printed circuit board 31. The solder is electrically connected between traces 33 and the juxtaposed second surface 26 of first portion 24 of each lead 21 of the lower package 10.

Upper package 10 of FIG. 2 is stacked on the lower package 10 so that keys 15 of the lower package 10 are each in a keyhole 16 of the upper package 10. Leads 21 of the lower package 10 are juxtaposed with and in contact with mirror-image leads 21 of the upper package 10, thus forming an electrical connection. Solder electrically connects second surface 26 of the third portion 22 of each lead 21 of the lower package 10 to the juxtaposed second surface 26 of the first portion 24 of the corresponding lead 21 of the upper package 10. The solder connections may be made by reflowing 80-20 solder that is plated on or otherwise pre-applied to the leads. Other conventional soldering methods can be used as well. In an alternative embodiment, an interposer circuit board may be inserted between the stacked packages, so that leads that are not juxtaposed may be electrically connected by traces on the interposer circuit board.

Figure 3:
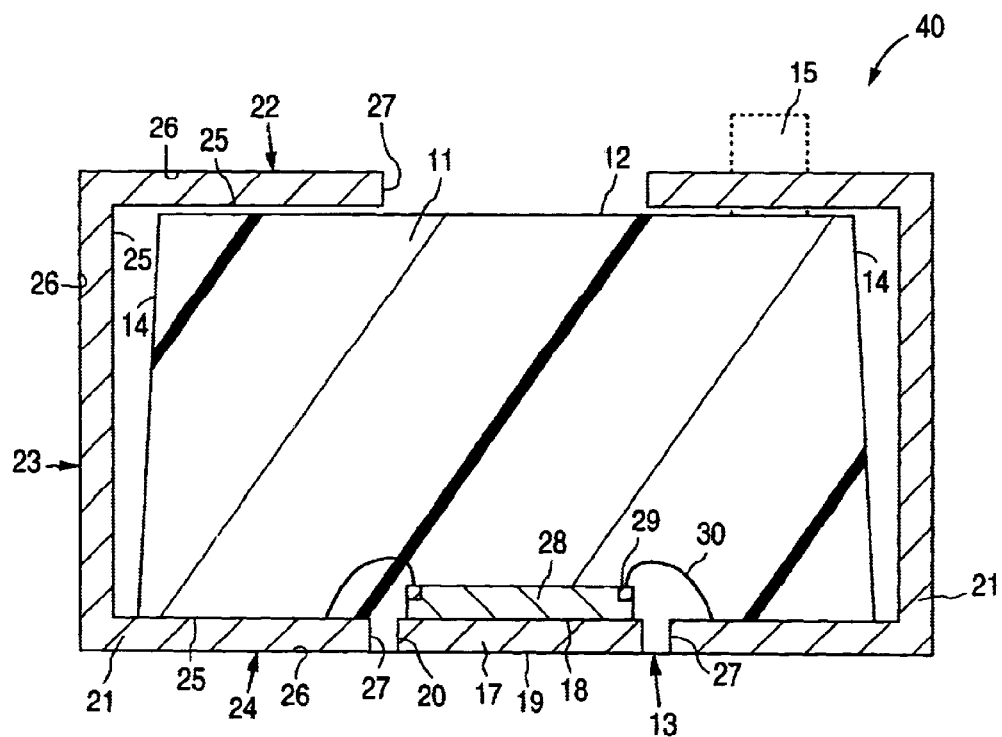
FIG. 3 is cross-sectional side view of a stackable package having an exposed die pad.

FIG. 3 shows a stackable package 40. Package 40 is similar to package 10 of FIG. 1. In package 40, however, die pad 17 is not up set into package body 11, but rather is embedded at lower second surface 13 of package body 11 in the same horizontal plane as first portion 24 of leads 21. Lower second surface 19 of die pad 18 is exposed at second surface 13 of package body 11. Second surface 26 of first portion 24 of each lead 21 also is exposed at second surface 13. Key 15 and keyhole 16 are relocated to another portion of first surface 12 and second surface 13, respectively, of package 40. To make room for key 15 and keyhole 16, one of the leads 21 of package 40 has been removed. In an alternative embodiment, key 15 and keyhole 16 may be located in an unoccupied area between die pad 18 and leads 21. The exposed die pad 17 of package 40 may be soldered to a metal portion of a printed circuit board in order to sink out heat from the package or to a ground voltage supply contact of the printed circuit board.

Figure 4:
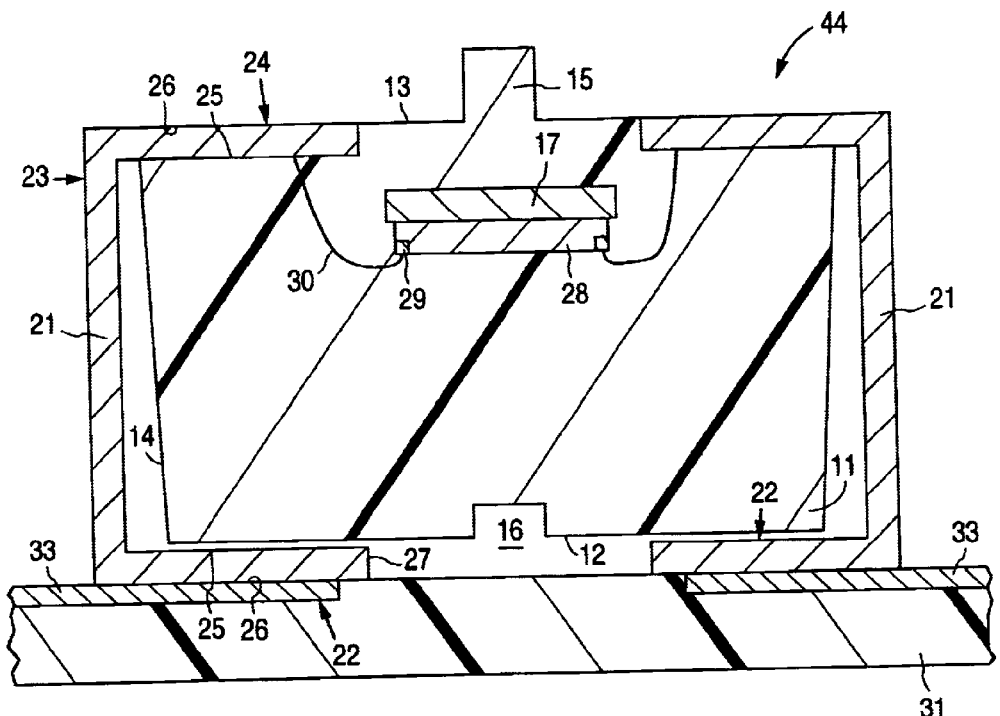
FIG. 4 is cross-sectional side view of a stackable package wherein a key extends from a package surface that is adjacent to die pad.

FIG. 4 shows another embodiment of a package 44 within the present invention. Package 44 is similar to package 10 of FIG. 1. One difference between package 44 and package 10 is that the locations of keys 15 and keyholes 16 are reversed. In package 44, keys 15 extend from second surface 13, and keyholes 16 are formed at first surface 12 of package 44. Because of the location of keys 15, package 44 is mounted on a printed circuit board 31 such that integrated circuit 28 is inverted and second surface 26 of third portion 22 of each lead 21 is electrically connected by solder to metal traces 33 on printed circuit board 31.

Figure 5:
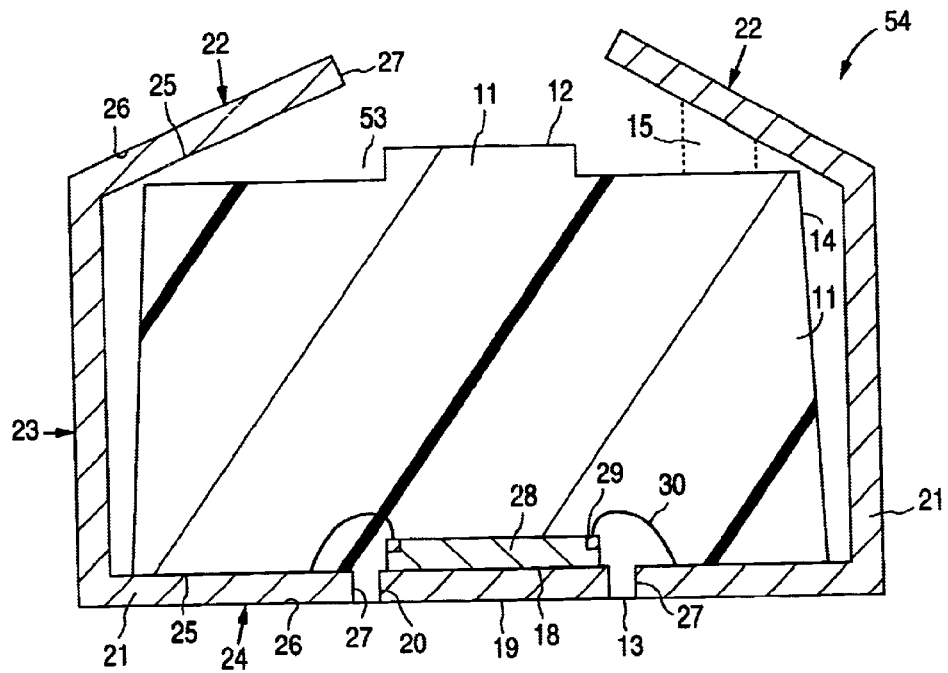
FIG. 5 is cross-sectional side view of a thin stackable package having leads that are bent at an oblique angle so as to apply a force to the leads of another package stacked thereon.

FIG. 5 shows another embodiment of a package 54. Package 54 is similar to package 40 of FIG. 3, except that third portion 22 of leads 21 extends over first surface 12 of package body 11 at an oblique angle provided during the trim and form operation that bends leads 21. The oblique orientation gives a spring-like action to leads 21 that forces the third portion 22 up against the leads 21 of another package that is stacked thereon. A metal having an inherent spring characteristic may be used for leads 21. Accordingly, a firm physical and electrical interconnection of the stacked packages 54 can be obtained without necessarily using a solder interconnection. In addition, package body 11 includes peripheral recesses 53 at its upper surface 12. Recesses 53 are located so that third portion 22 of the various leads 21 may be set therein, which allows a thinner package.

Figure 6A:
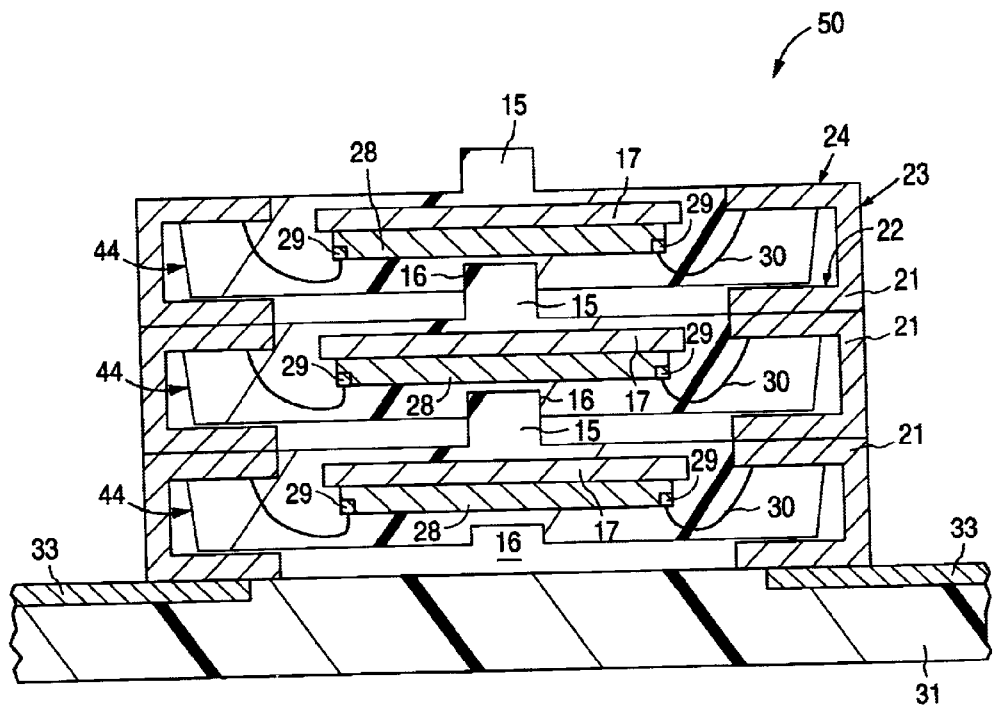
FIGS. 6A–6D show embodiments of interconnected packages.
Figure 6B:
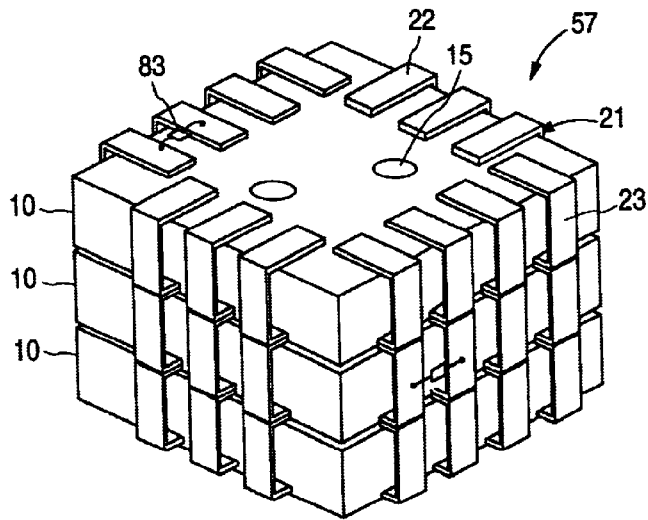
Figure 6C:
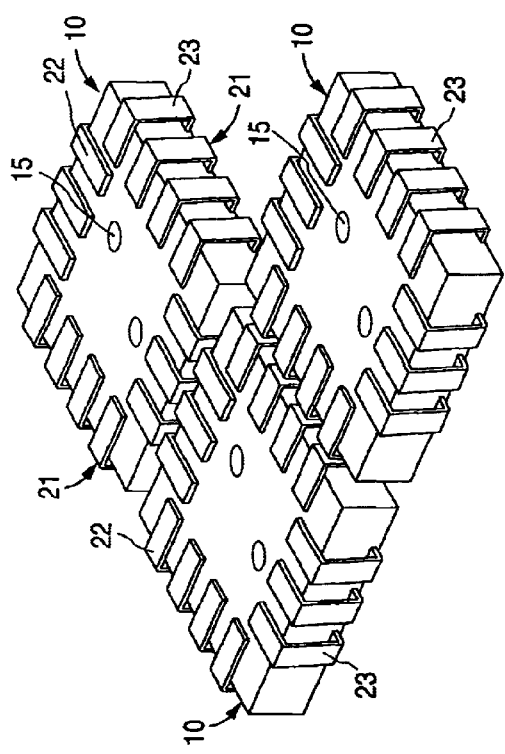
Figure 6D:
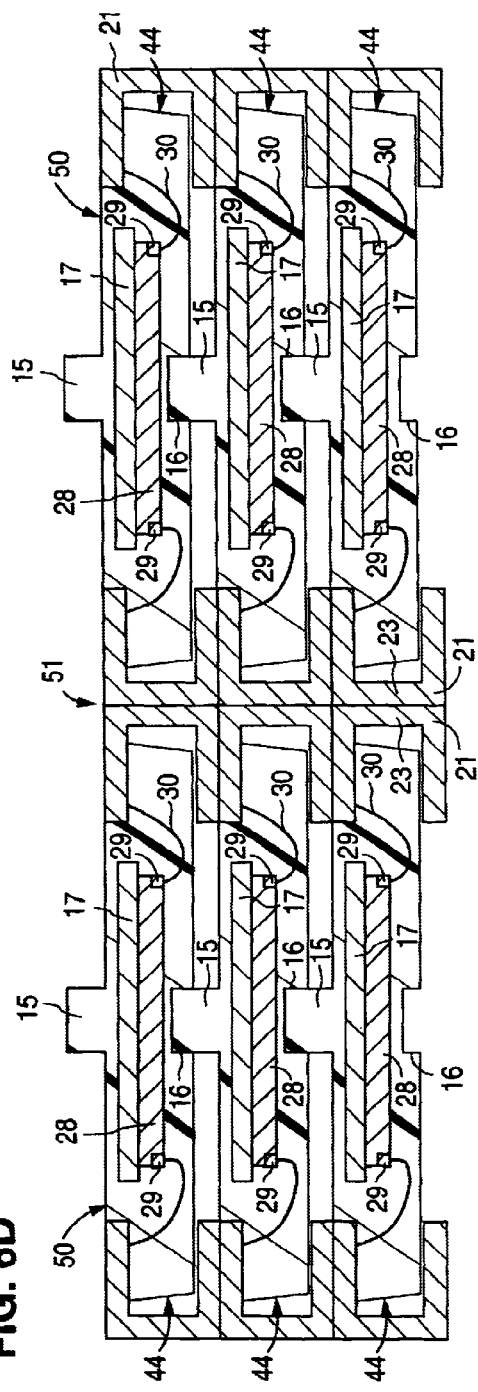

FIGS. 6A–6D show exemplary stacks of packages. FIG. 6A shows a cross-sectional side view of a stack 50 of three packages 44 (FIG. 4). FIG. 6B is a perspective view of a stack 57 of three packages 10. In this embodiment, optional passive devices 35 (e.g., a resistor, capacitor or inductor) are electrically connected between first portions 22 and second portions 23 of two adjacent leads 21 of the top and middle packages 10, respectively. FIG. 6C is a perspective view of three abutting and electrically interconnected packages 10 that are in a common horizontal plane. The juxtaposed vertical second portions 23 of the leads 21 of adjacent packages 10 are electrically interconnected so that the integrated circuits 28 therein may be electrically interconnected. FIG. 6D is a cross-sectional side view of a double stack 51 that includes two abutting and electrically interconnected stacks 50. The vertical second portion 23 of the right side leads 21 of the left stack 50 abut and are electrically connected by solder to the vertical second portion 23 of the left side leads 21 of the right stack 50. Accordingly, the integrated circuits 28 in stack 51 may be electrically interconnected. Artisans will appreciate that the other package embodiments shown herein may be stacked and/or horizontally interconnected in manners similar to those shown in FIGS. 6A–6D.

Figure 7:
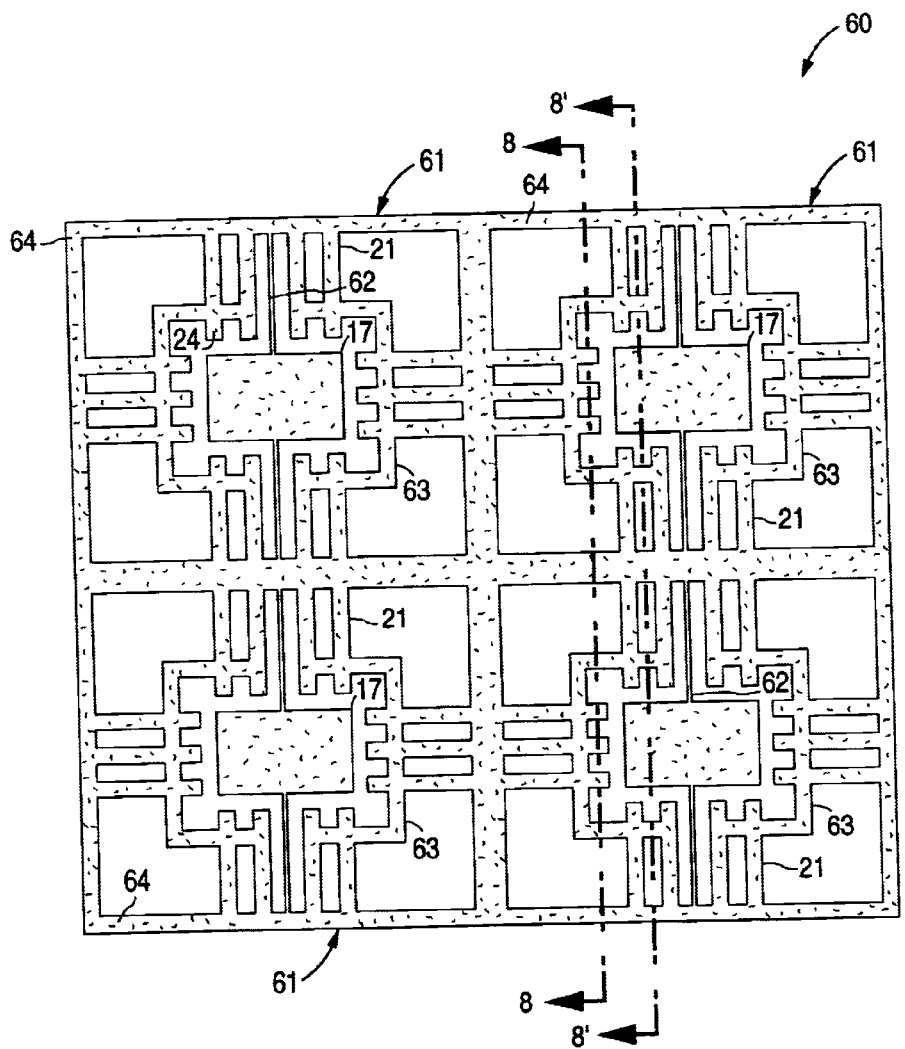
FIG. 7 shows a patterned metal sheet including an array of four leadframes.

FIG. 7 shows a patterned planar metal sheet 60 that includes an array of four planar leadframes 61. Sheet 60 may be used to make four of the various packages described herein in a parallel fabrication process. Sheet 60 may be made of conventional leadframe metals, such as copper, copper alloy, or Alloy 42, among other possibilities. The number of leadframes 61 on a metal sheet 60 is variable, and the specific pattern of the leadframe is variable. As an example, leadframe 61 may be 0.10 mm to 0.25 mm thick. Portions of leadframes 61 may be plated with conventional metals, such as nickel, gold, palladium or silver, to enhance solderability.

Each leadframe 61 of sheet 60 is within a rectangular frame formed by four tie bars 64. Lead frame 61 includes a die pad 17 and a variable number of leads 21. Leads 21 extend from a first end that is integrally connected with a tie bar 64 to a second end that is adjacent to, but separated from, die pad 17. A dam bar 63, which is located between the tie bars 64 and the die pad 17, is integrally connected across leads 21 around die pad 17. Metal sheet 60 may be formed by chemical etching using a photoresist mask, or by progressive stamping.

Leadframes 61 of FIG. 7 may be formed so that side surfaces 20 of die pad 17 and side surfaces 27 of at least first portion 24 of leads 21 have a reentrant profile. The reentrant profile functions to lock die pad 17 and leads 21 to the encapsulant of package body 11. In addition, side surfaces 20 and 27 may have numerous small asperities thereon, which also function to lock die pad 17 and leads 21 to the encapsulant. Anchors, such as a through-holes or ears, also may be provided for leads 21.

FIGS. 8A–8D show exemplary reentrant profiles for side surfaces 20 of die pad 17 and side surfaces 27 of leads 21. The view of side surface 20 of die pad 17 is taken along line 8'—8' of FIG. 7, and the view of side surface 27 of first portion 24 of leads 21 is taken along line 8—8 of FIG. 7.

Figure 8A:
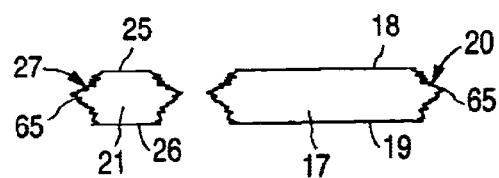
FIGS. 8A–8D show embodiments of reentrant profiles on the side surfaces of the die pad and the side surfaces of the leads.
Figure 8B:
Figure 8C:
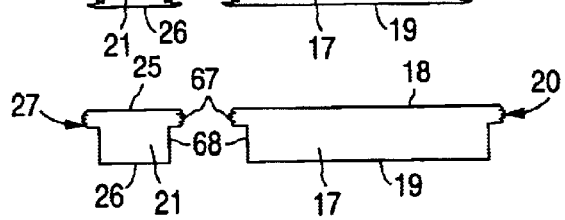
Figure 8D:
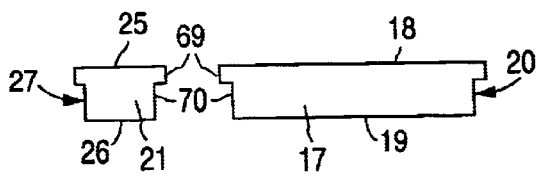

In FIG. 8A, side surfaces 20 and 27 include two reentrant portions on opposite sides of a protruding apex 65, and numerous small asperities that are much smaller in depth than the reentrant portions. This profile may be formed by chemically etching an unpatterned metal sheet from both sides and underetching, that is, etching for less time than would be required to form orthogonal side surfaces 20 and 27. The encapsulant of package body 11 fills the reentrant portions, covers apex 65 and fills the asperities. In FIG. 8B, side surfaces 20 and 27 include a central depression 66 and numerous small asperities. This profile may be formed by chemically etching an unpatterned metal sheet from one side and overetching, that is, etching for more time than would be required to form orthogonal side surfaces 20 and 27. The encapsulant fills depression 66 and the asperities. In FIG. 8C, side surfaces 20 and 27 include a cornice-like top portion 67 that begins at first surfaces 18 and 25 of die pad 17 and leads 21, respectively, and extends outward beyond a reentrant lower orthogonal portion 68 that is between protruding top portion 67 and second surfaces 19 and 26, respectively. Asperities cover top portion 67. Encapsulant 11 fills in under top portion 67 and fills the asperities. This profile may be formed by patterning metal sheet 60 using chemical etching or progressive stamping so that orthogonal side surfaces 20 and 27 are formed, and then coining first surfaces 18 and 25 to form top portion 67. Finally, in FIG. 8D, side surfaces 20 and 27 have an inverted L-shape that may be formed by stamping partially through the metal sheet. Encapsulant 11 fills in beneath the protruding top portion 69 and contacts reentrant orthogonal portion 70.

Figure 9:
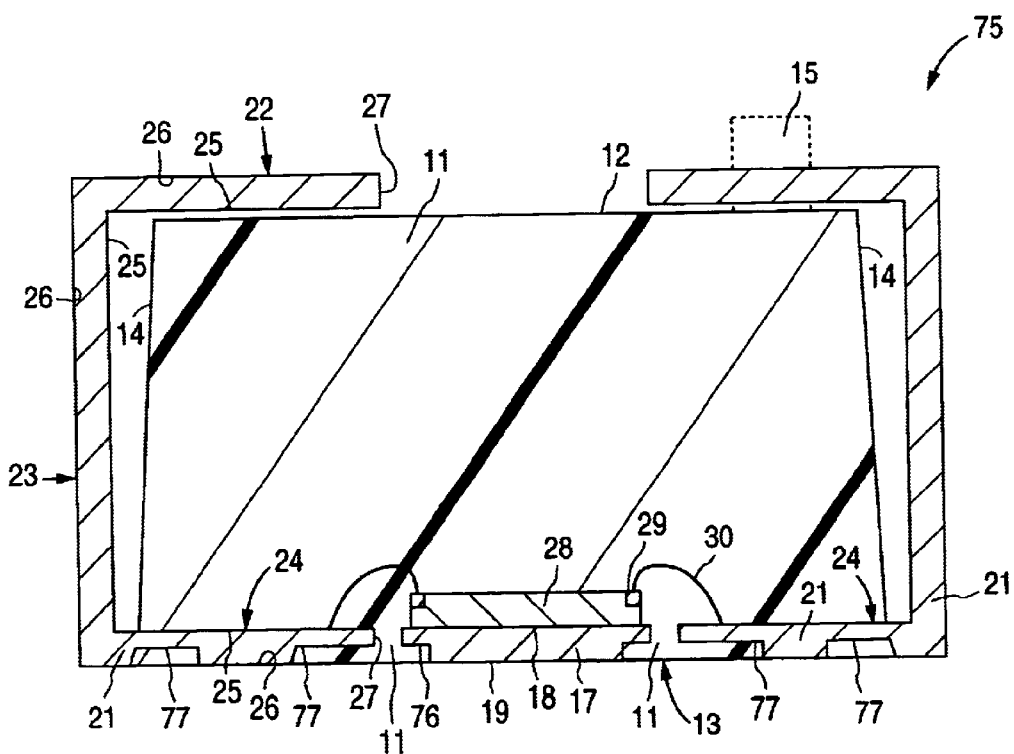
FIG. 9 is a cross-sectional side view of a stackable package wherein the encapsulant has filled in beneath undercut portions of the die pad and leads.
Figure 13:
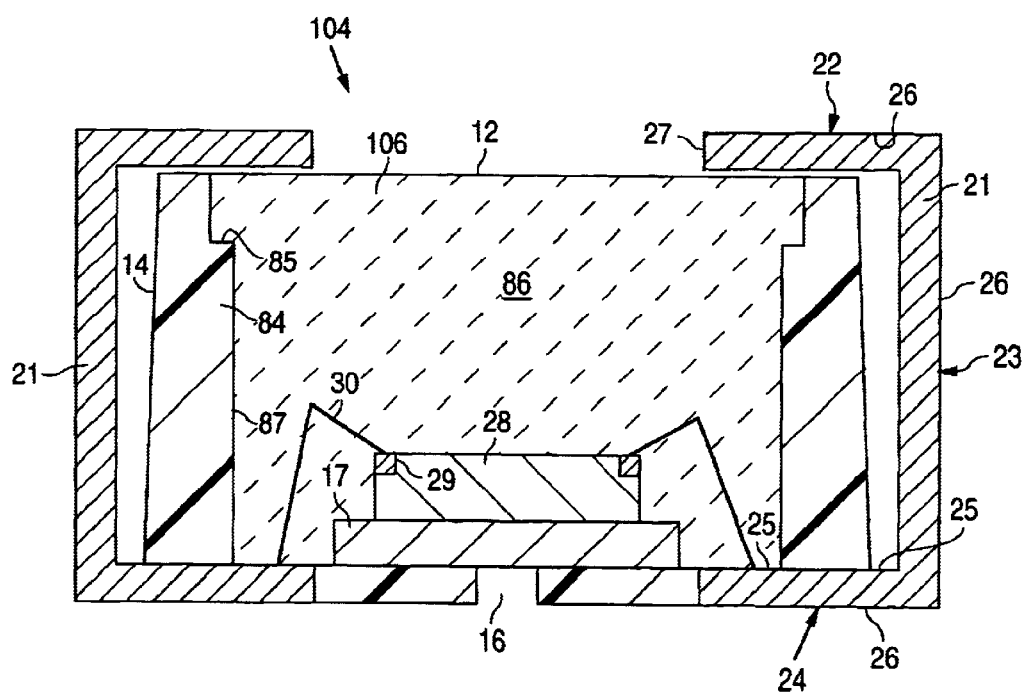
FIG. 13 is a cross-sectional side view of a stackable package having a cavity filled with an optically clear encapsulant.

FIG. 9 shows another package embodiment within the present invention. Package 75 of FIG. 13 is similar to package 40 of FIG. 3, except that package 75 has a different approach to locking die pad 17 and leads 21 to package body 11. In particular, a peripheral portion 76 of die pad 17 is undercut all around die pad 17. In addition, two regions 77 of first portion 24 of each lead 21 are undercut. Encapsulant fills in under undercut portions 76, 77 during the encapsulation step. The remaining parts of die pad 17 and leads 21, which have their original thickness, are exposed at second surface 13 of package 75 and thus are available for electrical connection.

Package 75 is formed from a leadframe similar to leadframe 61 of FIG. 7. After the leadframe is formed by chemical etching or progressive stamping, a photoresist pattern is placed on the leadframe. The mask has holes through which the portions of the leadframe that are to be undercut are exposed. Next, the exposed portions are etched away until a predetermined thickness remains, e.g., approximately half of the thickness of the leadframe, so that second surface 19 of die pad 17 and second surface 26 of first portion 24 of leads 21 have a reentrant profile (e.g., have undercut regions 76 and 77, respectively).

Figure 10:
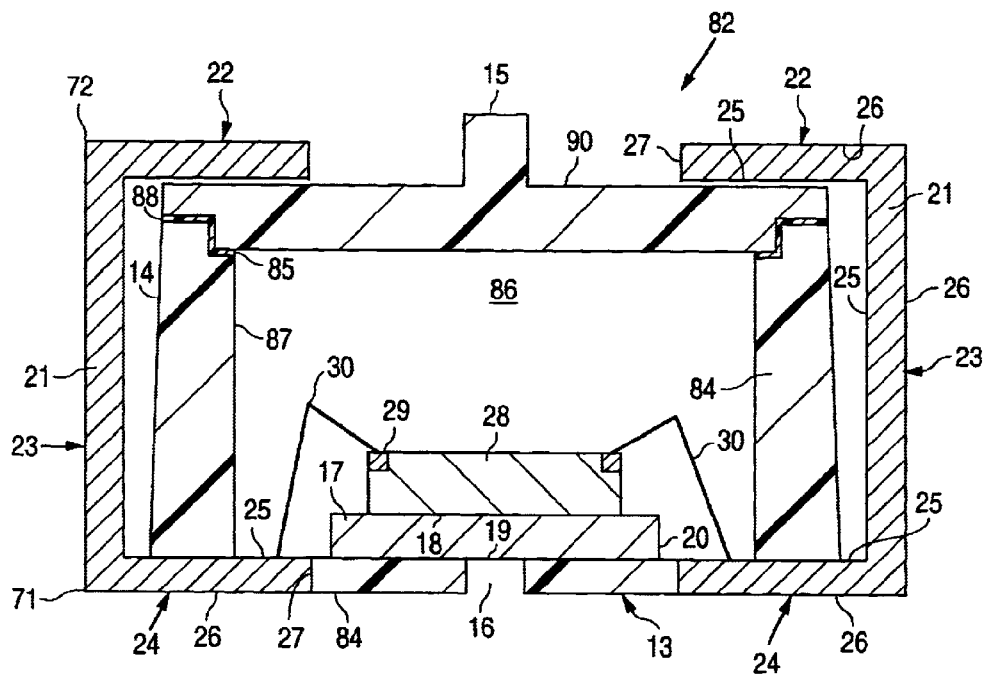
FIG. 10 is a cross-sectional side view of a stackable package having a cavity and a lid, wherein an electronic device is within the cavity.

FIG. 10 provides another embodiment of a stackable package within the present invention. Many of the features of package 82 of FIG. 10 (and the other packages discussed below) are common with the packages described above. Accordingly, the following discussion will mainly focus on the differences between the packages.

Package 82 of FIG. 10 includes a package body 84 formed of an insulative material. In this example, body 84 is formed of an injection molded plastic material. Body 84 includes a hollow central cavity 86 that is defined by inner sidewalls 87 and lower surface 13 of body 84. A lid 90 is attached across the top opening of body 84 so as to close cavity 86. Lid 90 includes a peripheral flange that rests on a shoulder 85 at the top opening of body 84. Lid 90 is attached to shoulder 85 with adhesive 88, e.g., an epoxy. Lid 90 may be molded from an insulative material. In this instance, lid 90 is opaque.

Lid 90 includes protruding keys 15. Keyholes 16 are formed at lower surface 13 of body 84 beneath die pad 17. Die pad 17 is up set into package body 84 such that lower second surface 19 of die pad 17 is covered with encapsulant.

Reentrant portions may be formed on side surfaces 19 of die pad 17 and side surfaces 27 of at least first portion 24 of leads 21 of package 82, as described above with respect to FIGS. 8A–8D. The reentrant portions lock die pad 17 and the embedded first portion 24 of leads 21 to package body 84. Alternatively, undercut portions 77 may be formed in first portion 24 of leads 21, as in FIGS. 9 and 11. The encapsulant fills in under undercut portions 77, thereby locking leads 21 to package body 84. As in FIG. 9, die pad 17 also may be provided with an undercut peripheral portion 76.

Package 82 and other packages described below are particularly appropriate for applications where electronic device 28 is of a type that is not to be covered with an encapsulant at all, or is not to be covered with an opaque encapsulant. For example, electronic device 28 of package 82 may be a gallium arsenide integrated circuit or a micro machine. Alternatively, electronic device 28 may be a sensor integrated circuit, such as a light sensing device (e.g., an EEPROM or camera integrated circuit) or a pressure or gas sensing device. Alternatively, electronic device 28 may be a light emitting device. (Light emitting and/or light receiving integrated circuits are often called optical integrated circuits herein.)

In package 82 of FIG. 10 (and other packages described below), electronic device 28 is mounted within a hollow cavity 86. In this example, electronic device 28 is an integrated circuit device, although that may vary. Bond wires 30 electrically connect bond pads 29 of integrated circuit 28 to an exposed portion of upper first surface 25 of first portion 24 of each lead 22. In other words, the encapsulant that forms package body 18 does not cover integrated circuit 28 or bond wires 30. In addition, encapsulant does not cover the inner portion of upper surface 25 of first portion 24 of leads 21.

Figure 19:
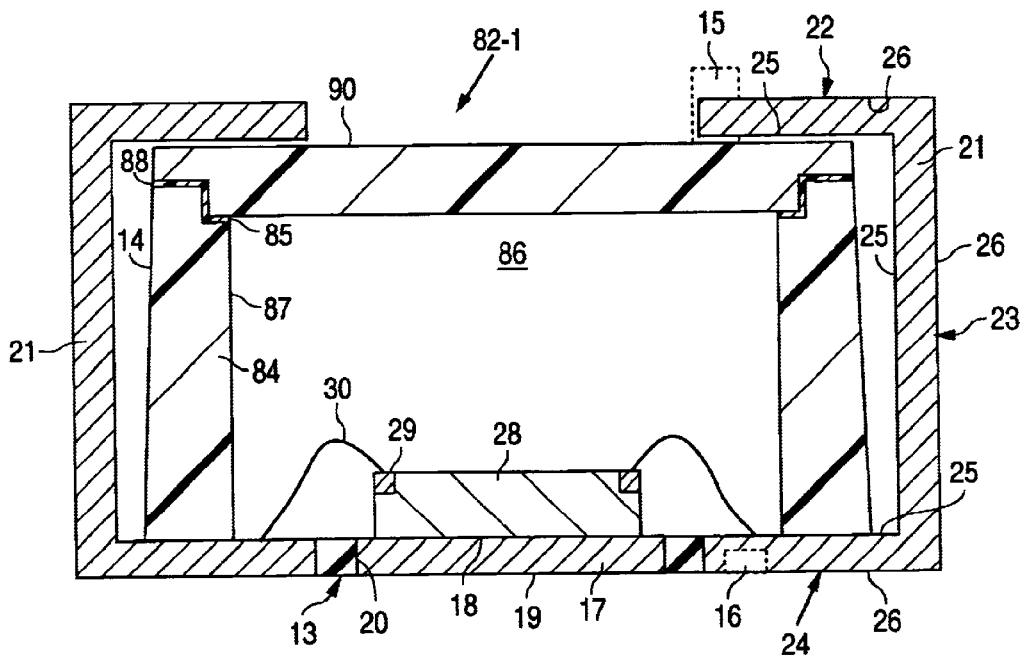
FIG. 19 is a cross-sectional side view of a stackable package having a cavity and a lid, wherein the die pad is exposed at the lower surface of the package body.

FIG. 19 provides an alternative embodiment of a stackable cavity package 82-1 that is similar to package 82 of FIG. 10. In package, 82-1, die pad 17 is not up set into package body 84, but rather is located in the same horizontal plane as first portion 24 of leads 21, i.e., at lower surface 13 of package body 84, similar to package 40 of FIG. 3. Keys 15 and keyholes 16 are relocated to an empty area of package body 84, with or without the removal of a lead 21, as described above for package 40. Lower second surface 19 of die pad 17 is exposed at lower surface 13. Accordingly, die pad 17 may be connected to a ground voltage or to a heat sink of a printed circuit board.

In a further alternative embodiment of package 82 (and the other stackable cavity packages described below), third portions 22 of leads 21 may be formed so as to extend at an oblique angle over lid 90 to facilitate connection to another package mounted thereon, as in FIG. 5.

In a further alternative embodiment of package 82 (and the other packages described below), at least one lead 21 may be electrically connected to die pad 17. The electrical connection can be made by a bond wire, or alternatively by an integral connection of a lead to die pad 17. Accordingly, the potential of die pad 17 may be controlled.

In a further alternative embodiment of package 82 (and at least packages 82-1, 92, 120, and 136 below), the location of the keys and keyholes may be reversed, as in FIG. 4. In other words, the key holes may be located are in the lid and the keys may extend from the surface of package body 84 closest to die pad 17. (As mentioned above, the number of keys and key holes may vary.)

Figure 11:
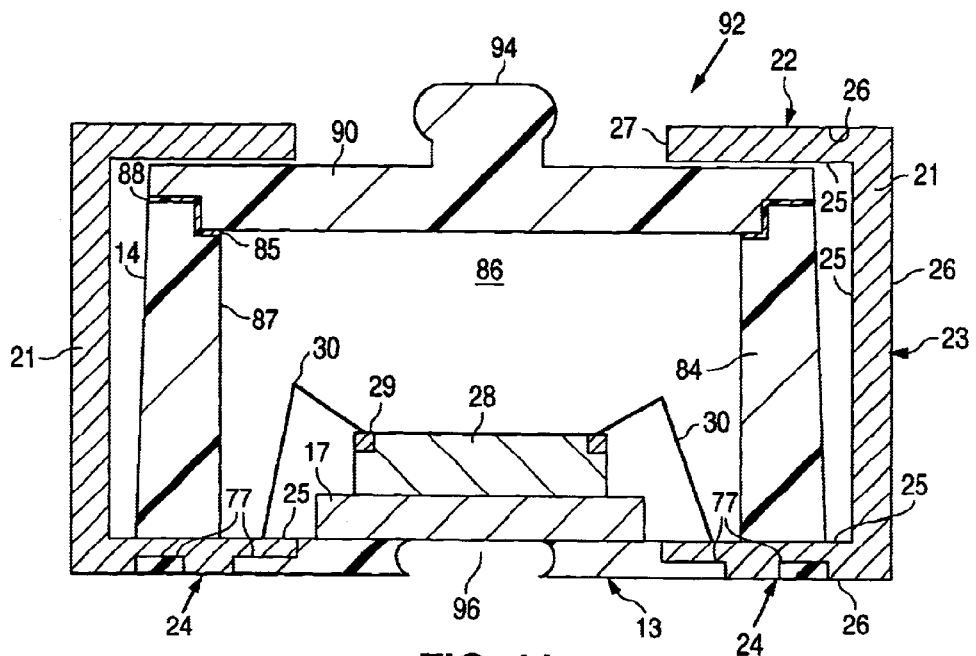
FIG. 11 is a cross-sectional side view of a stackable package having a cavity and a lid, wherein the key of the lid is a popbead that snaps into a correspondingly-shaped keyhole of another package stacked thereon.

FIG. 11 shows another embodiment of a stackable cavity package 92 within the present invention. Package 92 is similar to package 82 of FIG. 10. One difference between package 92 and package 82 of FIG. 10 is that first portion 24 of each lead 21 is provided with undercut portions 77 that are underfilled by the encapsulant material of body 84, thereby locking leads 21 to package body 84. Another difference is in the shape of the keys and keyholes that are used to align the packages for vertical stacking. In particular, keys 94 and keyholes 96 are shaped so that a key 94 of one package 92 snaps into a keyhole 96 of another package 92 stacked thereon, thereby both aligning the stacked packages 92 vertically and locking the packages 92 together. To that end, each key 94 is provided with a rounded, popbead at its free end. Each keyhole 96 is provided with a corresponding rounded shape to receive and hold a key 94.

Figure 12:
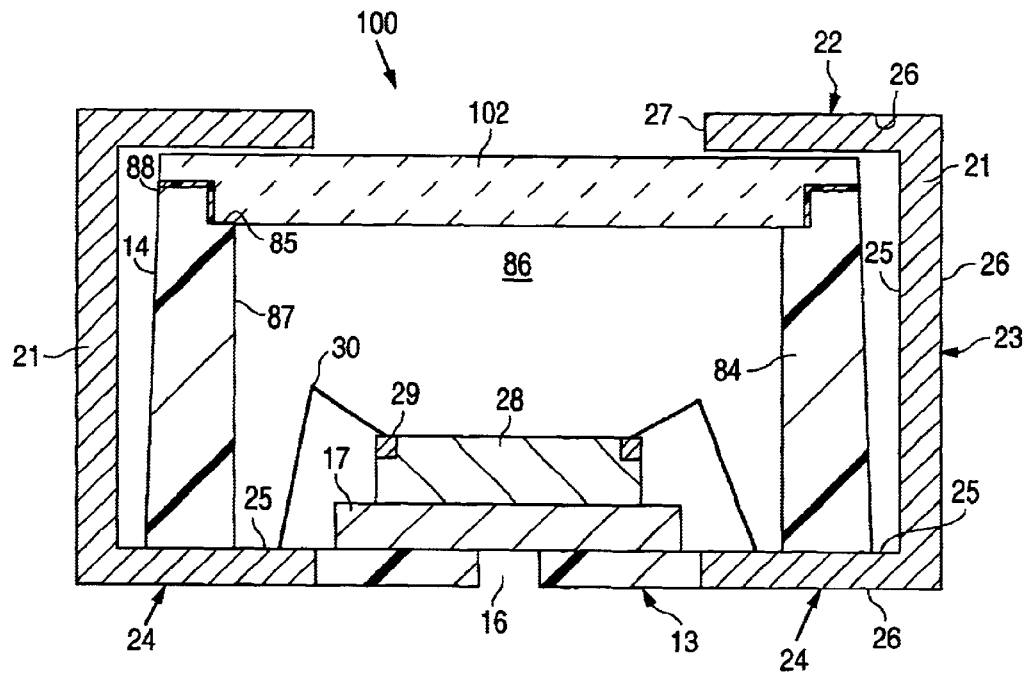
FIG. 12 is a cross-sectional side view of a stackable package having a cavity and a lid that is transparent to light.

FIG. 12 shows another embodiment of a stackable cavity package within the present invention. Package 100 of FIG. 12 is similar to package 82 of FIG. 10. One difference between package 100 and package 82 is that package 100 includes a lid 102 that is transparent to light, rather than an opaque lid. For example, lid 102 may be glass (e.g., borosilicate glass) or optically clear plastic. Lid 102 is supported on shoulder 85 and attached to body 84 with adhesive 88. Lid 102 is planar on both of its major surfaces and has a peripheral shoulder.

Package 100 of FIG. 12 includes an optical integrated circuit 28 on die pad 17 within cavity 86 of body 84. Lid 102 superimposes optical integrated circuit 28. Accordingly, light may be transmitted through lid 102 by optical integrated circuit 28 or onto optical integrated circuit 28 from an external source. Lid 102 does not include keys 15. Typically package 100 would be a stand alone package or the top package of a stack so that light may be transmitted unimpeded from or to optical integrated circuit 28. Keyholes 16 are formed at lower surface 13 of package body 84.

FIG. 13 provides another embodiment of a stackable package within the present invention. Body 84 of package 104 includes a central cavity 86 within which an optical integrated circuit 28 is mounted on up set die pad 17. Unlike package 100 of FIG. 12, however, package 104 of FIG. 13 does not include a lid 102. In addition, cavity 86 of body 84 of package 104 is filled with an optically clear encapsulant 106, through which light may be transmitted from or provided to optical integrated circuit 28. Encapsulant 106 forms most of upper surface 12 of package 104. Upper third portion 22 of each lead 21 extends horizontally over a peripheral portion of encapsulant 106. In an alternative embodiment, where integrated circuit 28 is not an optical integrated circuit, cavity 86 of body 84 could be filled with an opaque encapsulant.

Figure 14:
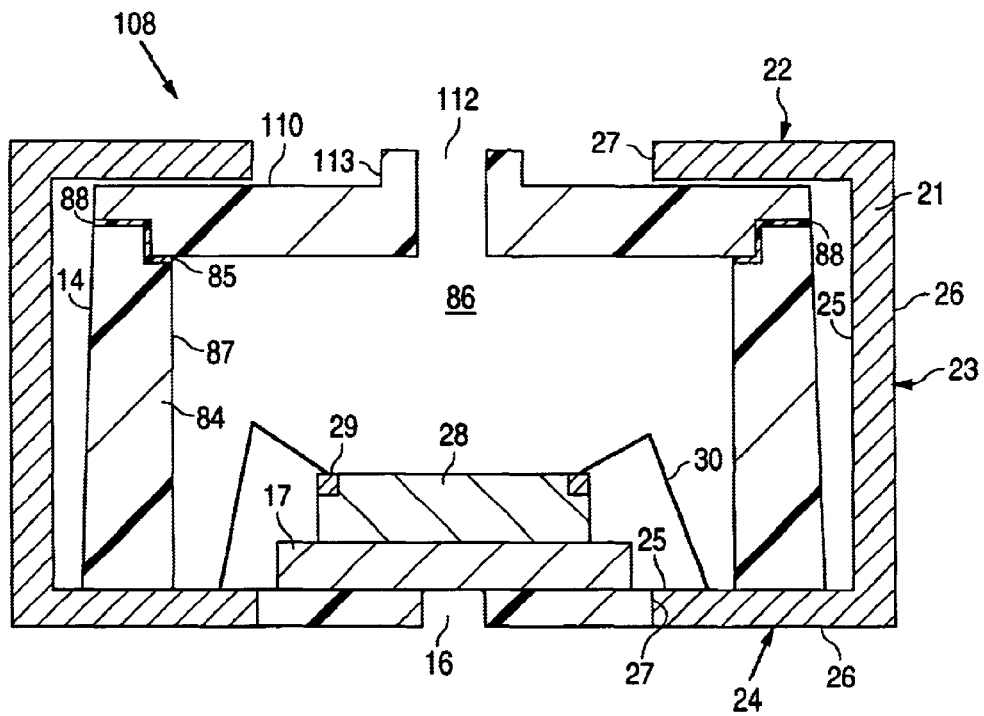
FIG. 14 is a cross-sectional side view of a stackable package having cavity and a lid, wherein the lid has a throughhole.

FIG. 14 shows another embodiment of a stackable package within the present invention. Package 108 of FIG. 14 is similar to package 82 of FIG. 10. One difference is that package 108 of FIG. 14 has a lid 110 with a central aperture 112. Aperture 112 superimposes integrated circuit 28, which is mounted on up set die pad 17 within cavity 86 of body 84. A ring 113 extends upward from lid 110 around aperture 112. Package 108 may be used where integrated circuit 28 is a sensor that needs to be exposed to the environment. For example, integrated circuit 28 may be a pressure or gas sensitive integrated circuit. Integrated circuit 28 of package 108 also may be an optical integrated circuit, in which case aperture 112 may transmit light.

Typically, package 108 will be a stand alone package or the top package of a stack. In an alternative embodiment, package 108 may be used where the electronic devices 28 of two packages must communicate with each other. Such an embodiment in shown in FIG. 17.

Figure 17:
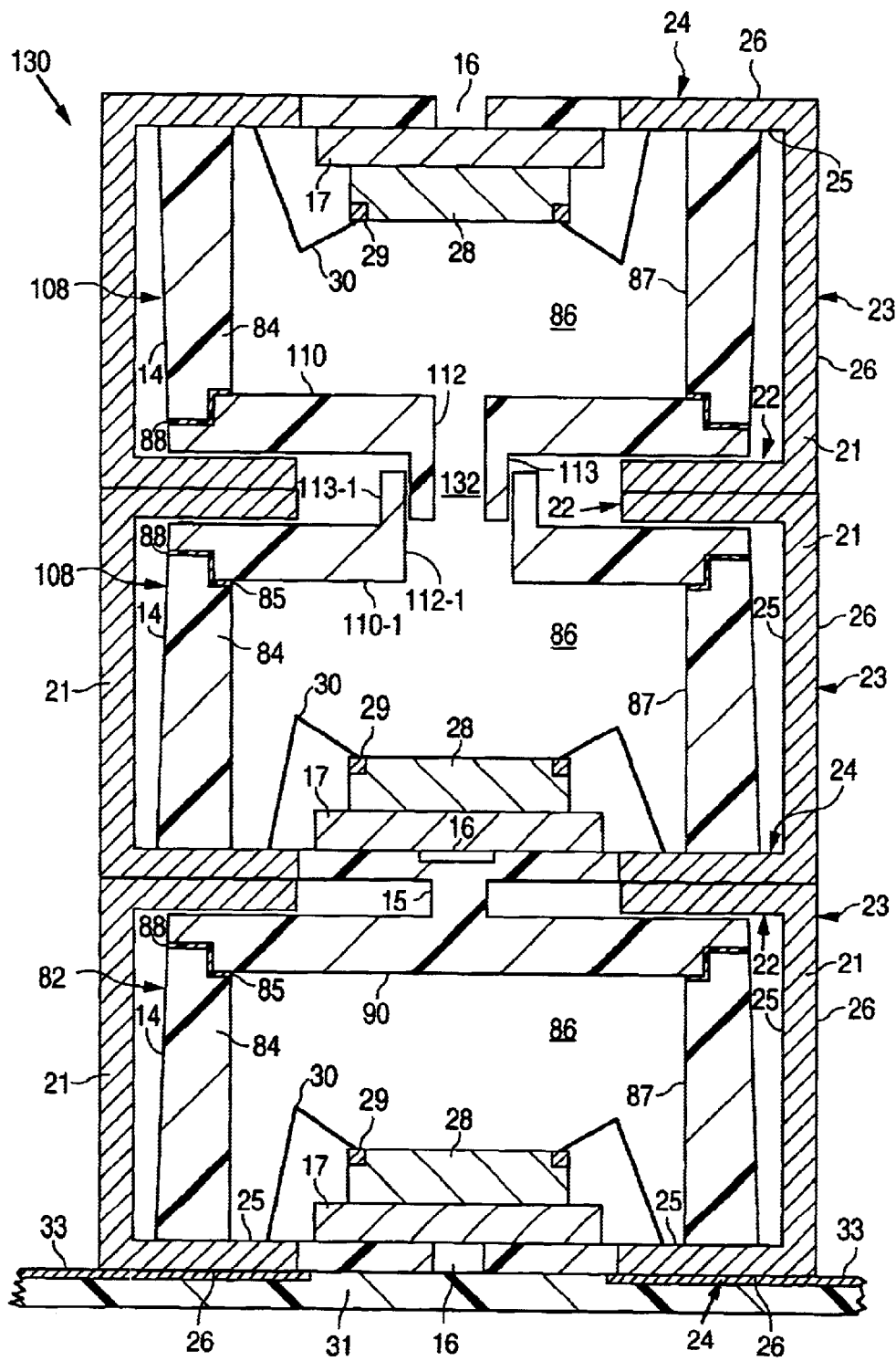
FIG. 17 is a cross-sectional side view of a stack of three stackable packages each having an internal cavity.

FIG. 17 shows a vertical stack 130 of three stackable cavity packages. Stack 13 includes a lowermost package 82 (FIG. 10) that is mounted on a substrate 31 (e.g., a printed circuit board). The lower second surface 26 of first portion 24 of each lead 21 of package 82 is electrically connected by reflowed solder to metal traces 33 of substrate 31.

Two packages 108 are vertically stacked on package 82. The middle package 108 includes keyholes 16 in which respective keys 15 of lower package 82 are inserted. The engagement of keys 15 and respective keyholes 16 aligns the stacked packages vertically, ensuring accurate electrical connections. The upper first surface 25 of third portion 22 of each lead 21 of lower package 82 is electrically connected to a juxtaposed lower surface 26 of first portion 24 of a respective lead 21 of the middle package 108. The electrical connection may be based merely on physical contact or may include reflowed solder. Middle package 108 has a lid 110-1 that has a large size aperture 112-1 therein. Aperture 112-1 superimposes the integrated circuit 28 of middle package 108.

The topmost package 108 of stack 130 is inverted so that its integrated circuit 28 faces the integrated circuit 28 of the middle package 108. Ring 113 of the top most package 108 is snugly inserted into the slightly-larger ring 112-1 of the middle package 108. A passage 132 extends between the middle and topmost packages 108 so that their respective integrated circuits 28 can communicate therethrough. In one embodiment, the two packages 108 of stack 130 may include optical integrated circuits 28 that communicate with each other using light. The juxtaposed surfaces 26 of third portions 22 of leads 21 of the two packages 108 are electrically connected.

Figure 15:
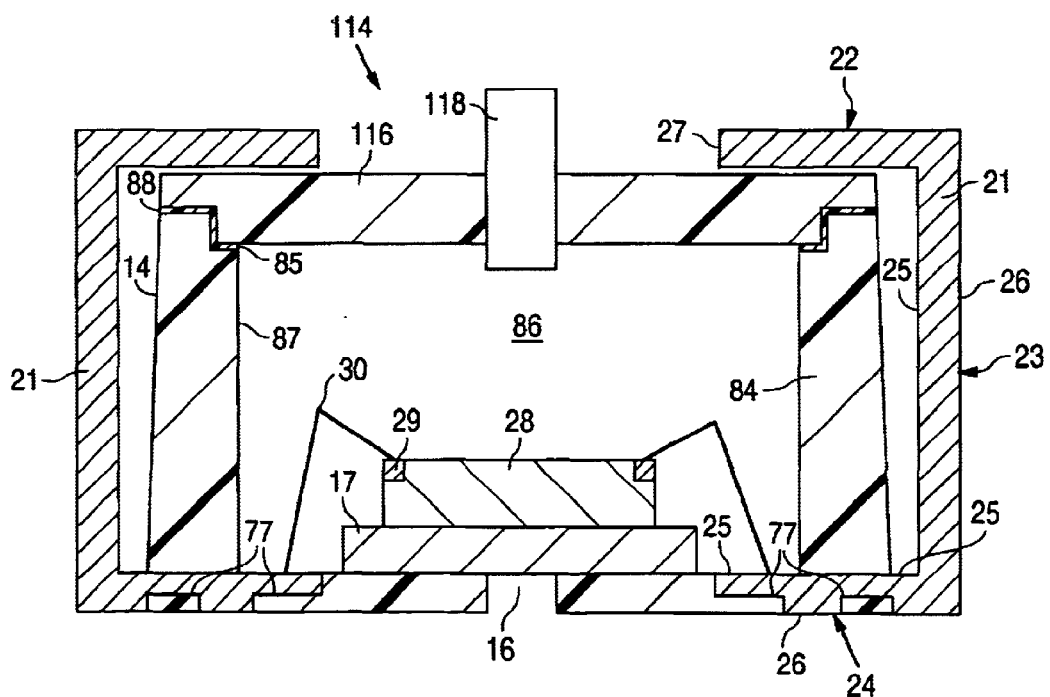
FIG. 15 is a cross-sectional side view of a stackable package having cavity and a lid with a throughhole, wherein a communication line extends through the throughhole and into the cavity.

FIG. 15 shows another embodiment of a stackable package within the present invention. Package 114 of FIG. 15 is similar to package 82 of FIG. 10, except that third portions 24 of leads 21 have undercut portions 77 for locking leads 21 to package body 84. Another difference is that package 114 has a communication line 118 inserted through and fixed in an aperture of lid 116. Communication line 118 superimposes integrated circuit 28. In one embodiment, communication line 118 may be a fiber optic line that transmits light to or from an optical integrated circuit 28. Alternatively, communication line 118 may be a hose for providing air or gas to a sensor mounted in package 114. Package 114 typically would be used at the top of a stack or in a stand alone function.

Figure 16:
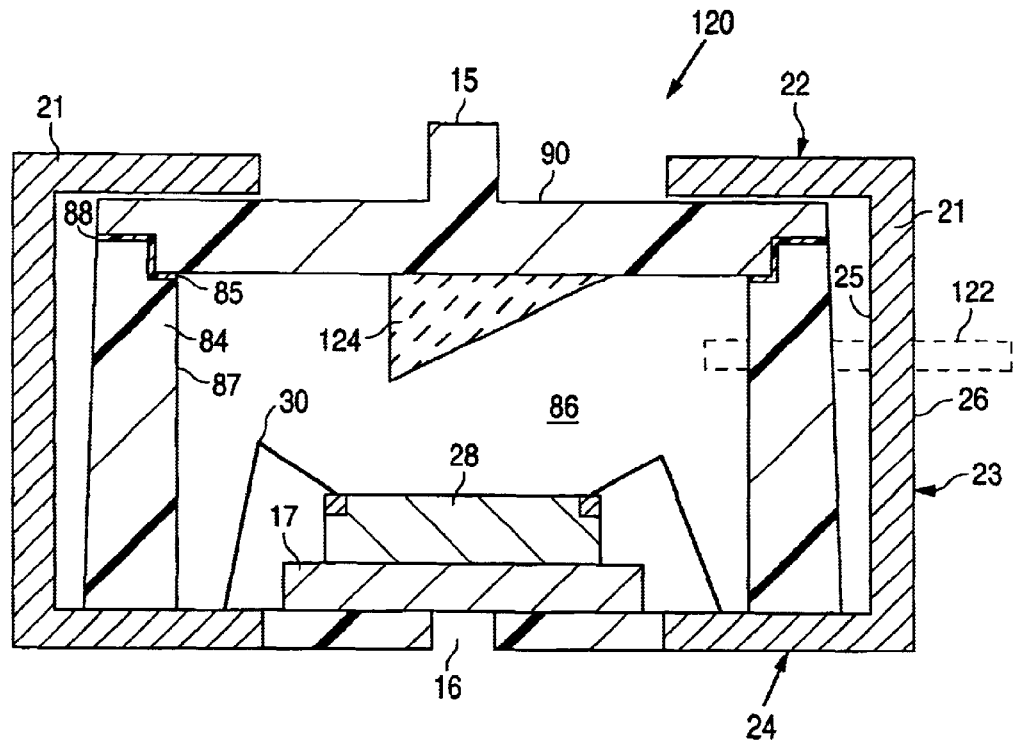
FIG. 16 is a cross-sectional side view of a stackable package having a cavity and a lid, wherein a light director is mounted on the lid within the cavity and a glass fiber extends into the cavity from a sidewall of the package body.

FIG. 16 shows another embodiment of a stackable cavity package within the present invention for an optical integrated circuit 28. Package 120 is similar to package 82 of FIG. 10, except that package 112 has a light director 124 (e.g., a prism or a mirror) mounted to the underside of lid 90 opposite key 15. In addition, a fiber optic line 122 enters cavity 86 through an aperture in the right sidewall of body 84. In this embodiment, light may be transported between fiber optic line 122 and optical integrated circuit 28 via light director 124. Package 120 may be used, for example, in vertical stacks where package 120 is not the topmost package of the stack. For example, package 120 may be used in place of package 82 of FIG. 17.

Figure 18:
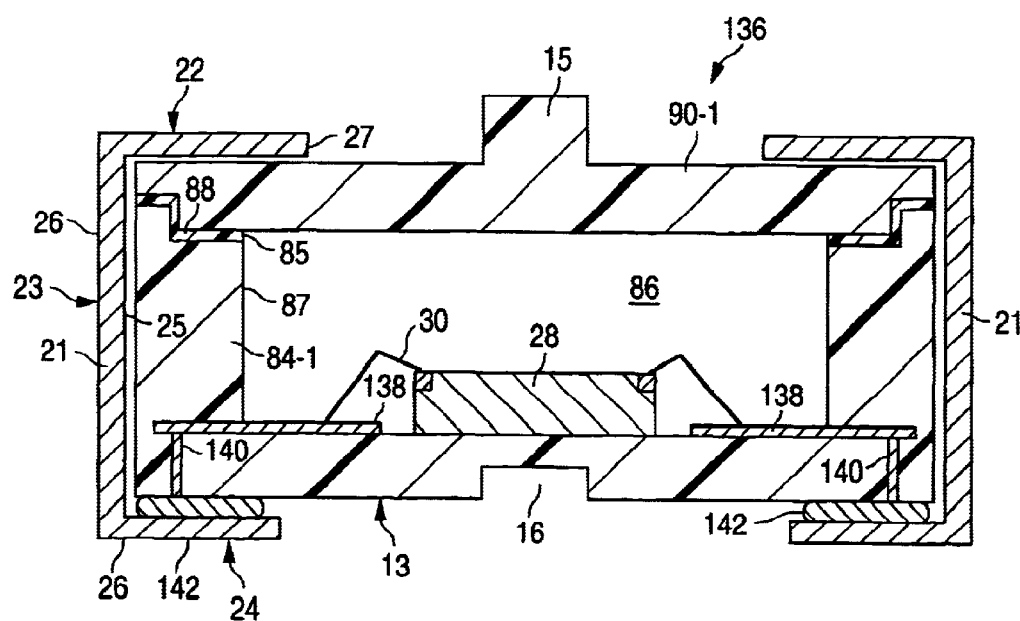
FIG. 18 is a cross-sectional side view of a stackable package having a cavity and a lid, wherein the package body is formed of ceramic.

FIG. 18 shows another embodiment of a stackable cavity package within the present invention. Package 136 of FIG. 18 has a body 84-1 and lid 90-1 that are formed of ceramic. Adhesive 88 may be a frit glass adhesive or epoxy. Accordingly, package 136 may be a hermetic package. Body 84-1 includes a cavity 86 within which integrated circuit 28 is mounted. Leads 21 are in a C shape and extend from bottom surface 13 of package body 84-1, upward adjacent to orthogonal outer side 14-1 of package body 84-1, and horizontally over lid 90-1. Package body 84 includes metal traces 138 within cavity 86 adjacent to integrated circuit 28.

Bond pads 29 are electrically connected by bond wires 30 to traces 138 within cavity 86. Traces 138 are each electrically connected by a tungsten via 140 to the bottom surface of package body 84-1. Upper surface 25 of first portion 24 of each lead 21 is electrically connected by brazed metal (e.g., copper and silver) to via 140, and thereby electrically connected to integrated circuit 28. In an alternative embodiment, integrated circuit 28 may be mounted on a metal die pad within cavity 86. In a further alternative embodiment, lid 90-1 may be formed of metal, such as Alloy 42 plated with nickel and gold, or stainless steel plated with nickel and gold, or nickel. Such a lid may be attached to body ceramic 84-1 with eutectic lead tin solder or 90-10 gold tin solder. To avoid short circuiting the leads to a metal lid, the diameter of cavity 86 and lid 90-1 is reduced so that the leads overhang only the ceramic package body 84-1.

Figure 20:
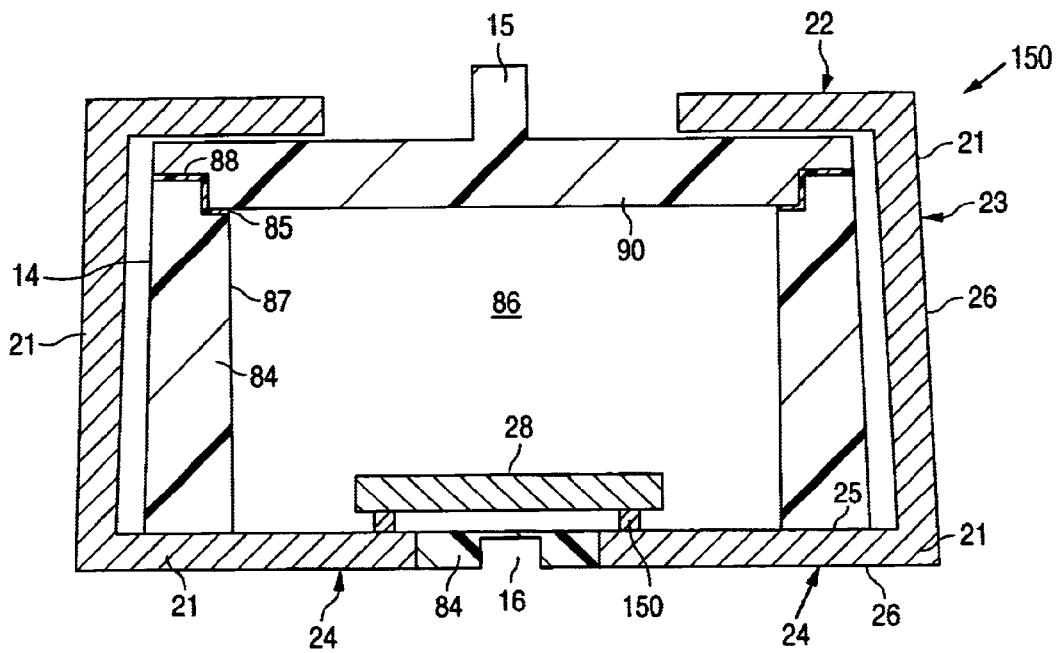
FIG. 20 is a cross-sectional side view of a stackable package having a cavity and a lid, wherein a flip chip integrated circuit is mounted within the cavity.

FIG. 20 is shows another embodiment of a stackable cavity package within the present invention for a flip chip integrated circuit 28. Package 150 of FIG. 20 is similar to package 82 of FIG. 10, except that a die pad is omitted. First surface 25 of first portion 24 of each lead 21 is exposed through the encapsulant that forms package body 84. Flip chip integrated circuit 28 mounts directly to upper first surface 25 of first portion 24 of leads 21. Underfill may or may not be used. Solder 150 electrically connects flip chip 28 to upper surface 25 of first portion 24 of leads 21.

Figure 21:
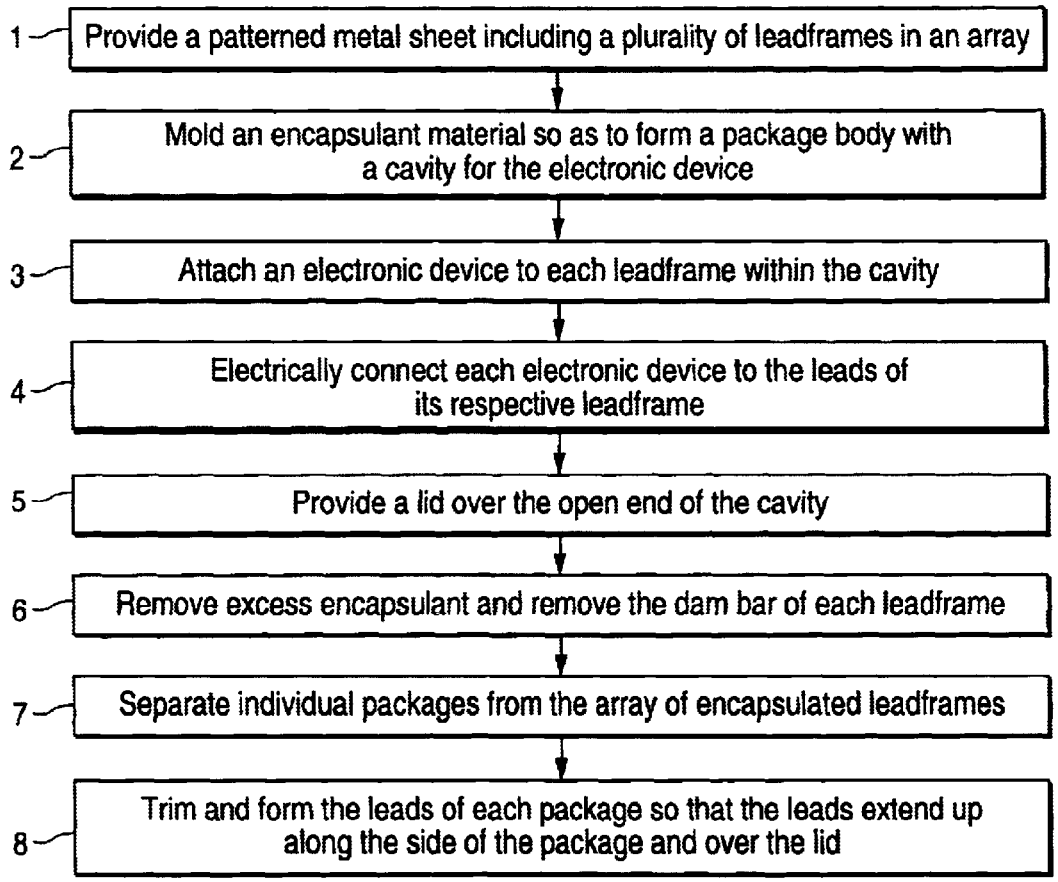
FIG. 21 is a flow chart of a method of making a stackable package having a cavity and a lid.

FIG. 21 is a flow chart of method 200 of making stackable package 82 of FIG. 10. Act 1 provides a leadframe 61, or a sheet 60 of leadframes 61, depending on whether the packages are made one at a time or in parallel. For the purpose of example, assume that Act 1 provides sheet 60 of FIG. 7. Side surfaces 20 of die pad 17 and side surfaces 27 of first portions 24 of leads 21 may be provided with reentrant portions, as in FIGS. 8A–8D. Alternatively, lower second surface 19 of die pad 17 and lower second surface 26 of first portion 24 of leads 21 may be provided with undercut portions 76 and 77, respectively, as in FIG. 9. In a further alternative embodiment, only leads 21 are provided with undercut regions, as in FIG. 11.

Act 2 forms a body 84 within dam bar 63 at each leadframe 61 of sheet 60 using an injection molding technique and an insulative plastic encapsulant. Body 84 is molded so as to have a hollow central cavity 86 within which integrated circuit 28 is located. A shoulder 85 is formed in the sidewalls of body 84 at the top opening of cavity 84. It is possible that a transfer molding technique may be used as an alternative. During the molding step, die pad 17 is up set in the mold so that encapsulant material fills in beneath lower second surface 19 of die pad 17. The molding compound covers the side surfaces 20 of die pad 16 and side surfaces 27 of third portions 24 of leads 21 within dam bar 63. The molding compound does not, however, cover lower surface 26 of first portion 24 of leads 21. The encapsulant material also does not cover upper surface 25 of first portion 24 of leads 21 within cavity 86 where bond wires 30 electrically connect to leads 21. Keyholes 16 also are formed during Act 2. The molding compound (i.e., encapsulant) is then cured. Alternatively, to form package 82-1 of FIG. 19, die pad 17 is not up set in the mold.

Act 3 mounts an integrated circuit 28 (or some other electronic device) on first surface 18 of each die pad 17 of the respective leadframes 61 of sheet 60 using, for example, conventional adhesives and pick and place equipment.

Act 4 electrically connects a metal bond wire (e.g., a gold or gold alloy bond wire) or between each bond pad 29 of each integrated circuit 28 and the exposed first surface 25 of a first portion 24 of each lead 21 of leadframes 61. Conventional bond wiring methods, equipment, and materials may be used.

Act 5 forms a lid 90 for each leadframe 61 using an injection molding technique or a transfer molding technique. Key 15 is formed during Act 5.

Act 6 places a lid 90 on each body 84 of sheet 60. Lid 90 is placed on shoulder 85 of body 84 and attached with an adhesive 88. Placing lid 90 on body 84 closes cavity 86, thereby enclosing integrated circuit 28. Conventional pick and place equipment may be used.

Act 7 is a deflash and debar step that removes excess encapsulant and dam bar 63. Conventional deflash and debar methods may be used. Act 8 separates the individual packages from patterned sheet 60 using, for example, a conventional punch. Leads 21 may be dipped in solder or plated with 80-20 solder or some other solder for subsequent electrical interconnection to a printed circuit board or to the abutting leads of other packages.

Act 9 rims and forms leads 21 so that leads 21 are provided with the bended C shape described above and shown in FIG. 10. In one embodiment, the trim and form operation includes a first lead bending step that forms a lower first bend 71 in lead 21. A second lead bending step forms an upper second bend 72 at the top of the sidewalls of body 84.

The various other embodiments of cavity packages can be formed by variations of the above process. For example, package 92 of FIG. 11 includes differently shaped keyholes 96 and keys 94, which are formed during Acts 2 and 5, respectively. Package 100 of FIG. 12 includes an optically clear lid 102. Lid 102 may be cut from a thin sheet of glass or a sheet of clear plastic. Package 104 of FIG. 13 may be formed by changing Act 5 so that, instead of providing a lid, cavity 86 of package body 84 is filled with a transparent encapsulant material (e.g., an optically clear liquid encapsulant material), which is then cured. Package 108 of FIG. 14 may be formed by providing an aperture 112 and ring 113 in lid 110 during the lid forming operation of Act 5. Package 114 of FIG. 15 may be formed by forming a lid 116 with an aperture therein during Act 5, and then inserting and attaching communication line 118 therein. Package 120 of FIG. 16 may be formed by forming an aperture in the sidewall of body 84 during the molding operation of Act 2, and thereafter inserting and attaching a fiber optic line 122 in the aperture. In addition, after lid 90 is formed in Act 5, a light director 124 (e.g., a prism or mirror) may be adhesively attached to the underside of lid 90. Package 150 of FIG. 20 may be formed by modifying leadframe 61 so as to eliminate die pad 17 and to extend the inner ends of leads 21 toward the center of leadframe 61. Subsequently, a flip chip is mounted directly to the exposed upper surfaces 25 of first portion 24 of leads 21. Package 136 of FIG. 18 is formed using conventional ceramic techniques.

Figure 22:
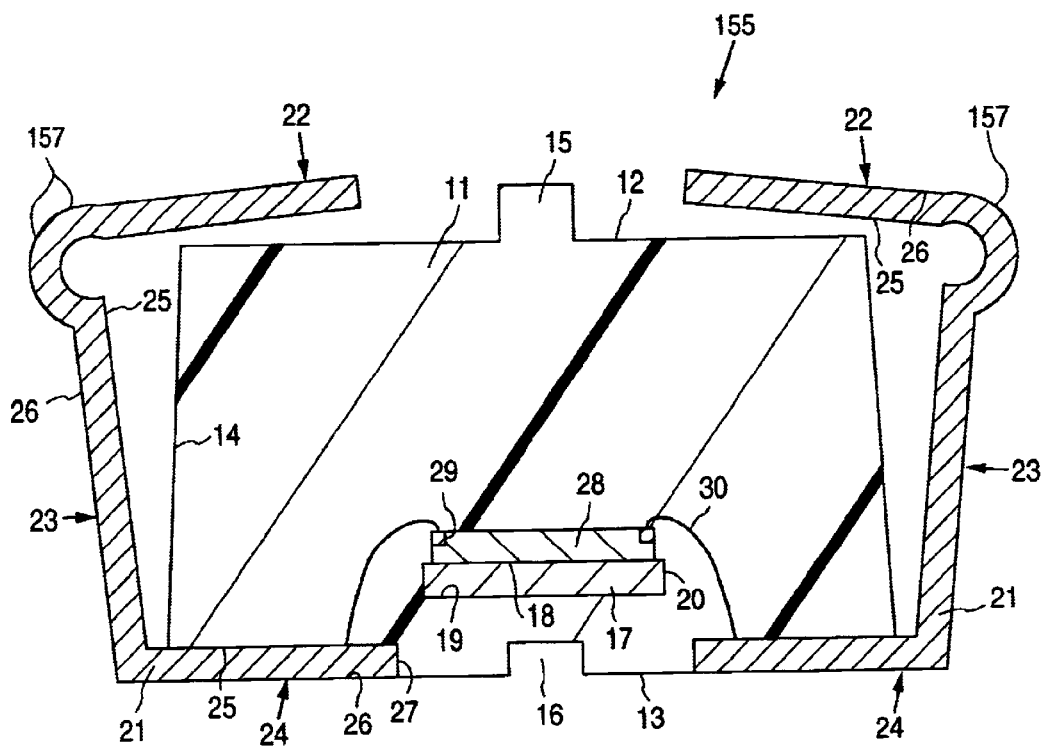
FIGS. 22 and 23 are cross-sectional side views of alternative stackable packages that may be stacked and mounted on a printed circuit board without soldering. The leads of the packages are formed of spring metal and have a crook-shaped spring member bent into a vertical portion of the lead.
Figure 23:
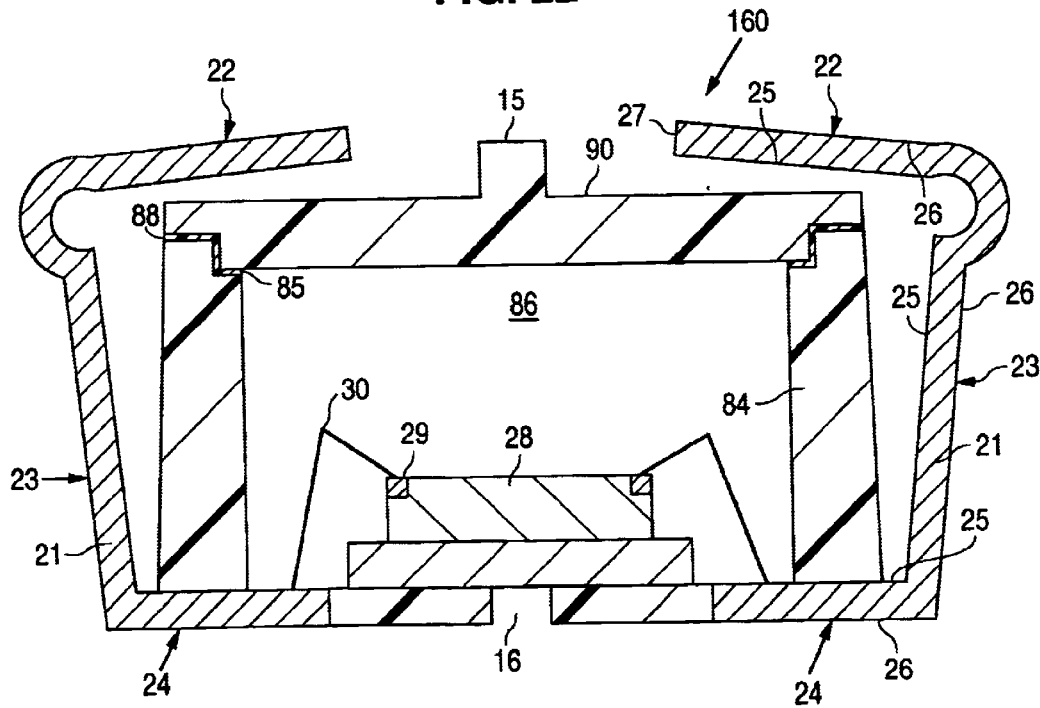
Figure 24:
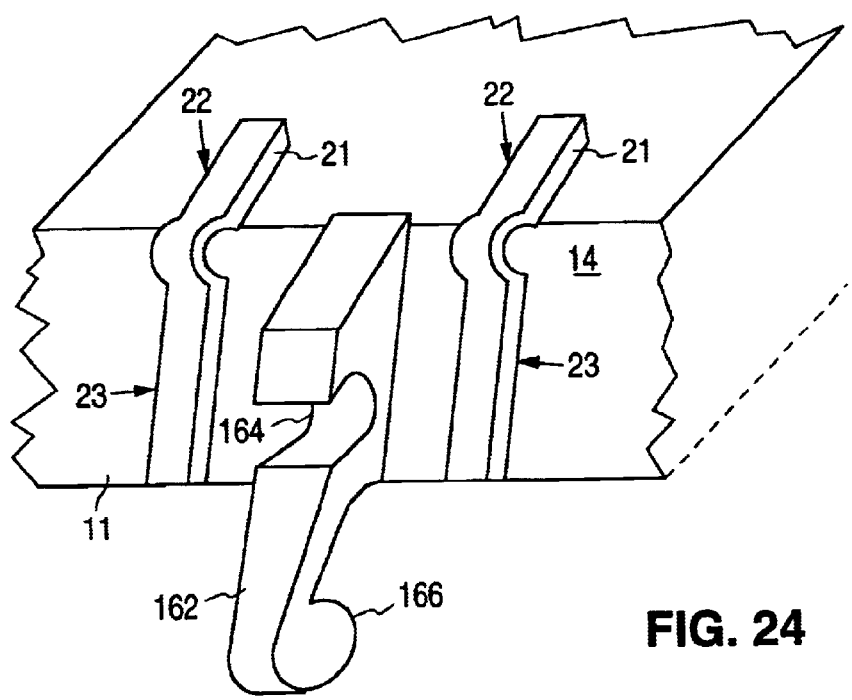
FIG. 24 is a perspective view of a stackable package having a stacking clip for interconnecting stacked packages.
Figure 25:
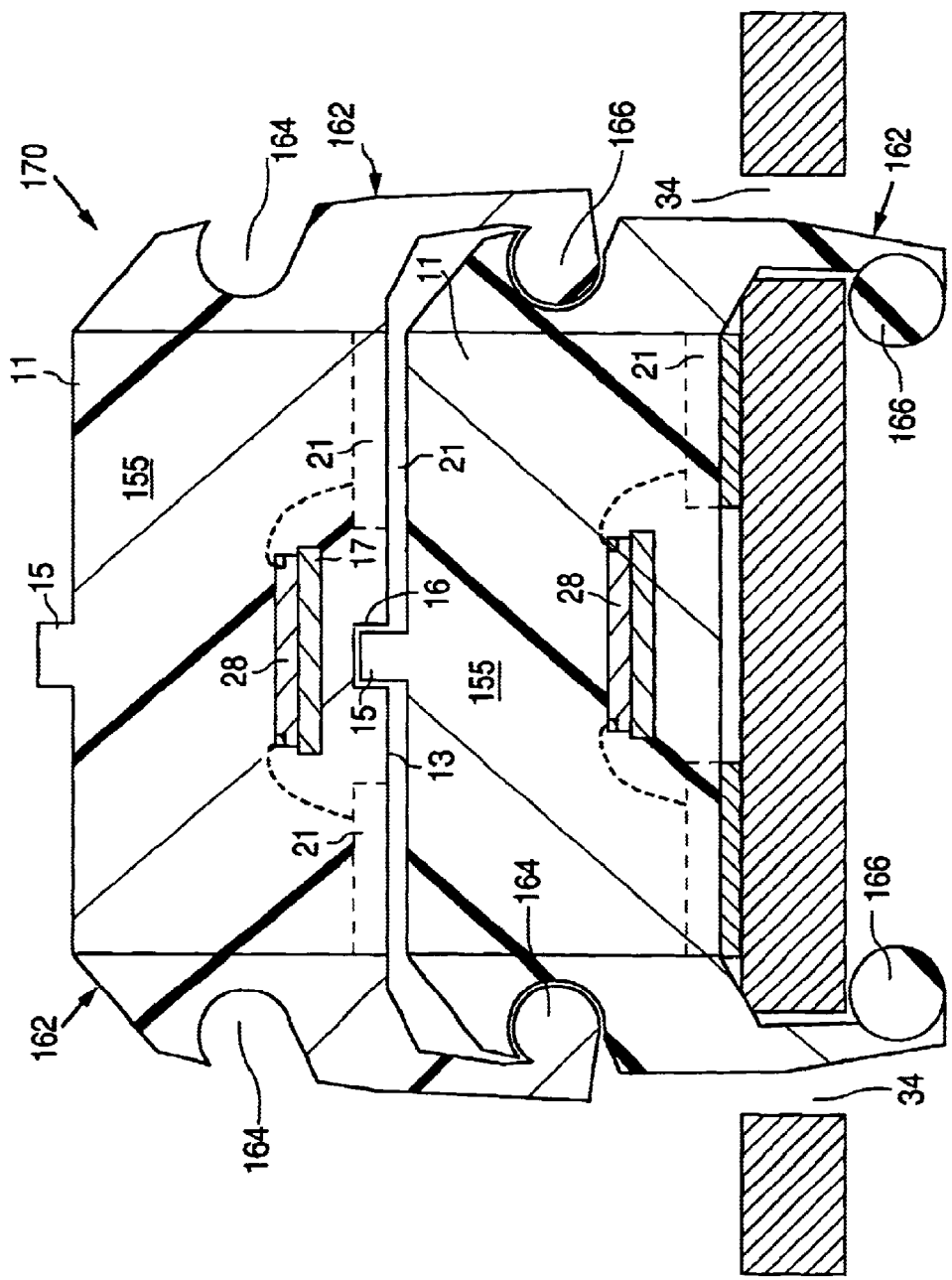
FIG. 25 is a cross-sectional side view of a stack of the packages of FIGS. 22 and 24, which shows the engagement of the stacking clips of the packages.

FIGS. 22 and 23 show further embodiments of stackable packages within the present invention. FIGS. 22 and 23 show packages 155 and 160, respectively, that are identical to package 10 of FIG. 1 and package 82 of FIG. 10, respectively, except for the addition of features that enable the packages to be stacked and electrically interconnected without soldering. These features include changes to leads 21, as shown in FIGS. 22 and 23, and the addition of molded stacking clips 162, as shown in FIGS. 24 and 25.

Figure 27:
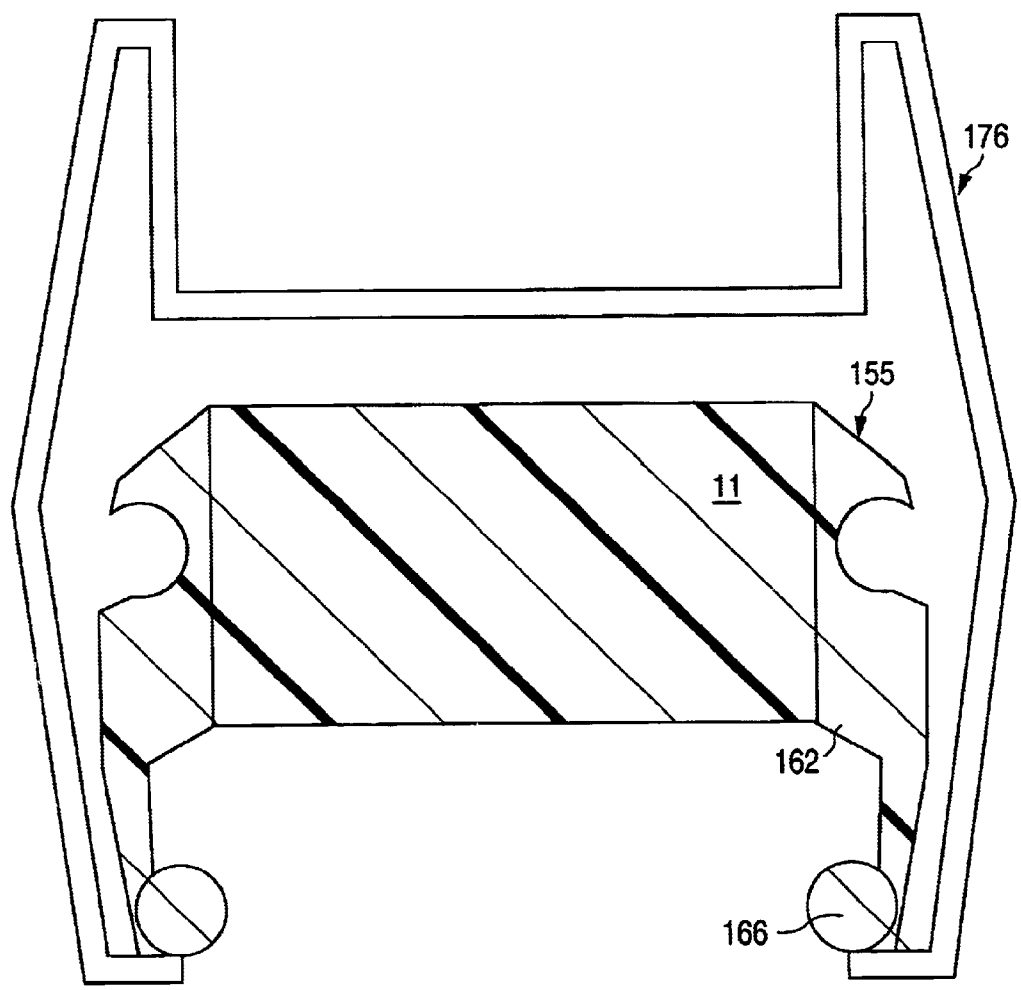
FIG. 27 is a cross-sectional side view of a tool for disengaging the clips of FIGS. 24 and 25.

Referring to FIGS. 22 and 23, leads 21 are formed of a spring metal, such as spring copper or spring steel, that has shape memory. Using a spring metal for leads 21 causes third portion 22 of leads 21 to apply a force directed away from the package body when deflected, and further causes second portion 23 of leads 21 to move laterally away from the package body. This spring action will cause third portion 22 of lead 21 to apply a continuous force against the juxtaposed, contacting leads of another package 155 or 160 stacked thereon, which helps to ensure a secure physical and electrical connection between stacked packages. An exemplary stack of packages having spring metal leads is shown in FIG. 27, although other packages and stacks discussed throughout this application also may be adapted to include spring metal leads 21.

In addition, leads 21 of packages 155 and 160 include a spring member that causes third portion 22 of leads 27 to apply a force directed away (upward in this case) from the package body when third portion 22 is deflected. In this embodiment, the spring member is an inwardly facing crook 157 in second portion 23. Crook 157 can be bent into second portion 23 of leads 21 formed during the trim and form step described above. Crook 157 causes third portion 22 of leads 21 to apply a continuous force against the leads of another package stacked thereon, which helps to ensure a secure electrical connection between stacked packages. An exemplary stack is shown in FIG. 27.

While packages 155 and 160 include both spring metal leads and a spring member formed in lead 21, an alternative embodiment may use only one of these features.

Packages 155 and 160 also may include a molded stacking clip to hold the stacked packages together. For instance, package 155 of FIGS. 24 and 25 includes a molded stacking clip 162 that is an integral part of package body 11 of package 155. Clip 162 is formed during the molding of package body 11. The shape and vertical orientation of clip 162 may vary.

Referring to FIG. 24, clip 162 has the form of a cantilever beam that is integrally connected to, and extends outward and downward from, peripheral side 14 of package body 11. Clip 162 is located between a pair of leads 21. A lead 21 may have to be removed to accommodate clip 162. In one embodiment, package 155 includes two clips 162, each on an opposite side of package body 11. Alternatively, package 155 may include four clips 162, one on each of the four sides 14 of package body 11.

Clip 162 includes an outwardly-facing ball-shaped recess 164 at an upper portion of clip 162 that is located adjacent to side 14 (see also FIG. 25). A lower, free portion of clip 162 extends below lower second surface 13 of package body 11. The free end of clip 162 includes a protuberance, which in the case has the shape of a ball and is denoted as ball 166. Ball 162 is inwardly directed with respect to sides 14 of package body 11. In an alternative embodiment, the upper portion of clip 162 may be varied so that recess 164 is formed in package side 14, rather than in the upper, outer portion of clip 162. Of course, in such an embodiment, the free end of the clip would have to extend further inward.

Referring to stack 170 of FIG. 25, recess 164 and ball 166 are shaped and located so that a ball 166 of a top package 155 (or 160) will fit snugly into a recess 164 of a bottom package 155 stacked with the first package. Further, clip 162 of the upper package 155 will apply an inwardly-directed spring force against the lower clip 162 engaged therewith. The resulting tight engagement of the clips 162 of the top package 155 to the corresponding clips 162 of the lower package 155 holds stack 170 together, ensuring a secure physical and lead-to-lead electrical connection between the packages 155 without the need for a soldered connection. Third portion 22 of leads 21 of the packages 155 of FIG. 15 is shown by dotted lines.

In FIG. 25, printed circuit board 31 includes apertures 34 that are sized and located so that the lower free portion of the respective clips 162 of the lower package 155 can be inserted into a corresponding aperture 34. The clips 162, being slightly forced outward by the location of apertures 34, apply a strong inwardly-directed spring force against the inner sides of the aperture 34. Further, balls 164 press with an upwardly-directed force against the lower side of printed circuit board 31, thus pulling the exposed second surface 26 of first portion 24 of the leads 21 of the lower package 155 firmly against the metal traces 33 of printed circuit board 33. Accordingly, the stack 170 of packages 155 can be electrically connected to printed circuit board 31 without soldering.

Stack 170 may be formed by aligning the respective clips 162 on the upper and lower packages 155, and then pressing the upper package 155 downward so that the clips 162 of the upper package travel downward along the corresponding clips 162 of the lower package 155 until ball 166 snaps into recess 164. The clips 162 of the lower package are then spread slightly and inserted through apertures 34. The order of these steps may be varied.

In an alternative embodiment, if it is known that a particular package will form a bottom package of a stack, then the free portion of clip 162 below recess 164 may be omitted, and the exposed surface 26 of first portion 24 of leads 21 of the lower package may be soldered to the printed circuit board.

Although, as mentioned above, packages 155 and 160 have both spring leads 21, crooks 157, and clips 162 to secure them together, in particular cases one or the other of the features may be omitted, although the resulting packages would not be so securely fixed to each other.

Figure 26:
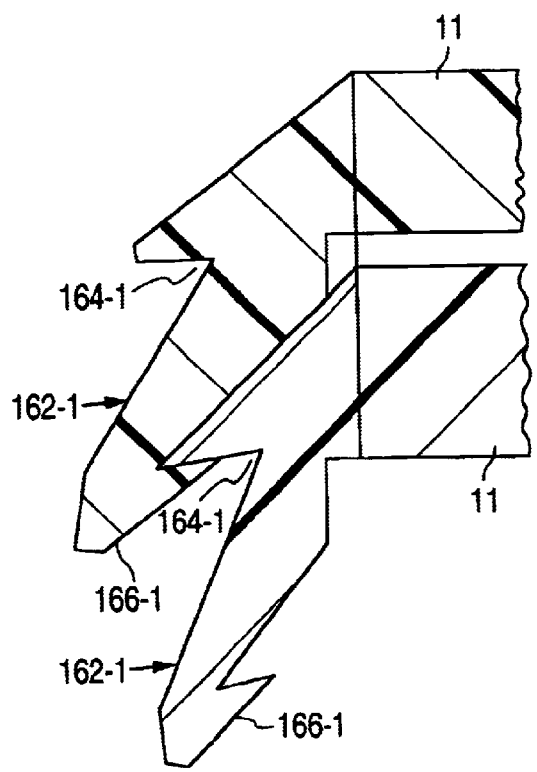
FIG. 26 is a cross-sectional side view of an alternative stacking clip.

FIG. 26 shows an alternative style clip 162-1 that may be used in place of clip 162 of FIGS. 24 and 25. In this case, the recess in clip 162-1 is an upwardly-directed V-shaped groove 164-1, and the protuberance at the free end of clip 162-1 is an upwardly-directed wedge 166-1 that is shaped and located so as snap snugly into a groove 164-1 of a clip 162-1 of a lower package.

FIG. 27 shows an exemplary tool 176 that may be used to disengage the packages of stack 170 of FIG. 25. Tool 176 is a spring clip that may be made of spring steel or tempered steel. Lower members 178 extend horizontally inwards towards package 155. A member 178 fits snugly under each ball 164. By squeezing vertical members 180 at a location above bend 182, lower members 178 force balls 166 outwards, thereby disengaging ball 166 from the corresponding recess 164 (FIG. 25).

Figure 28:
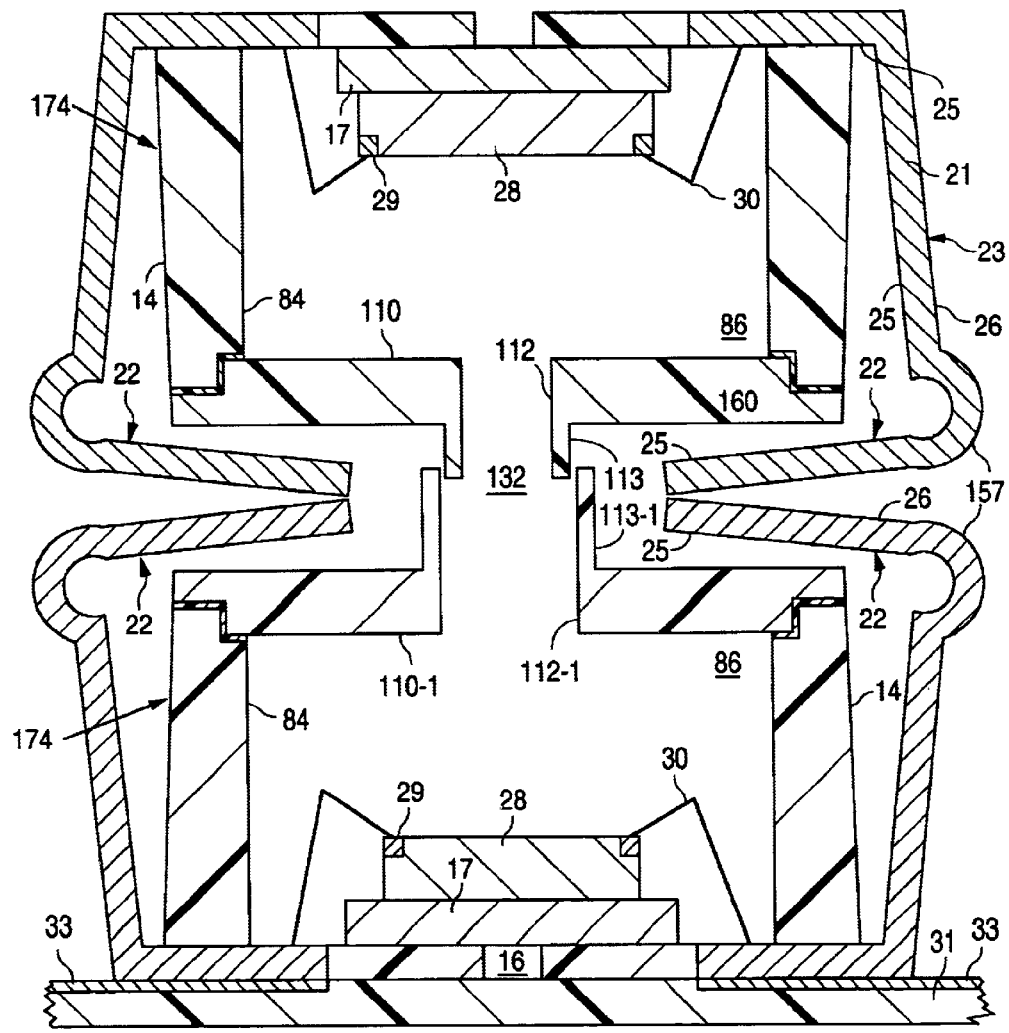
FIG. 28 is a cross-sectional side view of a stack of packages wherein the leads of the packages are formed of a spring metal and have a spring member bent into the vertical portion of the leads.

FIG. 28 shows a stack 172 of two packages 174. Packages 174 are the same as packages 108, as shown in FIG. 17, except that leads 21 of packages 174 are formed of spring copper or another spring metal and have a crook 157. The juxtaposed third portions 22 of leads 21 of the two packages 174 apply a spring force against each other, which electrically connects the packages together. The exposed surface 26 of first portion 24 of the leads 21 of the lower package 174 are soldered to metal traces 33 of printed circuit 31. The electronic devices 28 (e.g., sensor integrated circuits or optical integrated circuits) in the two packages 174 are in communication with each other (e.g., optical or air pressure communication) through aperture 132. If desired, clips similar to clips 162 of FIG. 24 and 25 may be formed on the sides 14 of the upper and lower packages 174, although the clips would have to be inverted on the upper package 174.

The embodiments described herein are merely examples of the present invention. Artisans will appreciate that variations are possible within the scope of the claims.

I claim:

1. A stackable package for an electronic device comprising:

a molded package body having a bottom first surface, an opposite top second surface, side surfaces extending vertically between the first and second surfaces, and one or more integrally molded stacking clips each at and integral with a side surface of the package body, wherein each stacking clip is adapted to engage a package body of a similar stackable package that is to be stacked therewith; and an electronic device within the body of the stackable package.

2. The stackable package of claim 1, wherein the clip includes a free end distal from said package body.

3. The stackable package of claim 2, wherein the clip includes a protuberance at the free end of the clip, and the package body further includes one or more recesses each adapted to receive a protuberance of the second similar package that is to be stacked therewith.

4. The stackable package of claim 3, wherein the recess is formed in a portion of the clip.

5. The stackable package of claim 1, further comprising a plurality of leads each electrically connected to the electronic device, each said lead having a first portion embedded in the package body and having a first surface exposed at the first surface of the package body, a second portion extending toward the second surface of the package body adjacent to a side surface of the package body, and a third portion that extends over the second surface of the body.

6. The package of claim 5, wherein the leads are comprised of spring metal.

7. The stackable package of claim 5, wherein the second portion of the leads includes a spring member, and said spring member is adapted to cause the third portion of the leads to apply a force directed away from the package body when deflected.

8. The stackable package of claim 7, wherein the spring member comprises a crook.

9. The stackable package of claim 5, wherein the embedded first portion of the leads includes at least one encapsulated undercut portion.

10. The stackable package of claim 5, wherein the embedded first portion of each lead includes a second surface opposite the exposed first surface and peripheral side surfaces between the first surface and the second surface of the lead, and the peripheral side surfaces include an encapsulated reentrant portion.

11. The stackable package of claim 1, wherein the package body includes a hollow cavity within which the electronic device is mounted, and a lid covering an opening of said cavity.

12. The package of claim 1, wherein said package body includes a member protruding from the first or second surface of the package body, and the other of the first or second surfaces of the package body includes a hole, and the member is adapted to fit within the hole of a similar second package to be stacked with the stackable package.

13. The package of claim 12, further comprising a plurality of leads each electrically connected to the electronic device, each said lead having a first portion embedded in the package body and having a first surface exposed at the first surface of the package body, a second portion extending toward the second surface of the package body adjacent to a side surface of the package body, and a third portion that extends over the second surface of the body, wherein the second portion of the leads includes a spring member, and said spring member is adapted to cause the third portion of the leads to apply a force directed away from the package body when deflected.

14. The package of claim 1, wherein the clips are engaged with a substrate and apply a continuous force that forces the package against the substrate, thereby forming an electrical connection between the package and the substrate.

15. The stackable package of claim 1, further comprising a plurality of leads each in an electrical connection with the electronic device, wherein a portion of each said lead is located to contact a corresponding lead of the similar stackable package that is to be stacked with the package.

16. The stackable package of claim 15, wherein said package body includes a member protruding from the first or second surface of the package body, and the other of the first or second surfaces of the package body includes a hole, and the member is adapted to fit within the hole of a similar second package to be stacked with the stackable package.

17. A stackable package for an electronic device comprising:

a molded package body having a bottom first surface, an opposite top second surface, side surfaces extending vertically between the first and second surfaces, and one or more integrally molded stacking clips each at and integral with a side surface of the package body, wherein each stacking clip is adapted to engage a package body of a similar stackable package that is to be stacked therewith; and an electronic device within the body of the stackable package, wherein the package body includes a hollow cavity within which the electronic device is mounted.

18. The stackable package of claim, 17 wherein the package body includes a lid covering an opening of said cavity.

19. The stackable package of claim 18, wherein the lid is transparent to light.

20. The package of claim 17, wherein said package body includes a member protruding from the first or second surface of the package body, and the other of the first or second surfaces of the package body includes a hole, and the member is adapted to fit within the hole of a similar second package to be stacked with the stackable package.

21. The stackable package of claim 17, wherein said hollow cavity is open to an exterior of the cavity.

22. The stackable package of claim 17, wherein at least one communication line is inserted into the hollow cavity.

23. The stackable package of claim 22, wherein the hollow cavity houses a light directing means to direct light between the electronic device and the at least one communication line.

24. A stackable package for an electronic device comprising:

a molded package body having a bottom first surface, an opposite top second surface, side surfaces extending vertically between the first and second surfaces, and one or more integrally molded stacking clips each at and integral with a side surface of the package body, wherein said package body includes a member protruding from the first or second surface of the package body, and the other of the first or second surfaces of the package body includes a hole, and the member is adapted to fit within the hole of a similar second package to be stacked with the stackable package, and each stacking clip is adapted to engage a package body of the similar second stackable package;

an electronic device within the body of the stackable package; and a plurality of leads each in an electrical connection with a electronic device, wherein a portion of each said lead is located to contact a corresponding lead of the similar second stackable package.

25. The stackable package of claim 24, wherein the leads are adapted to apply a compressive spring force to the contacted leads of the similar second stackable package.

* * * * *